US011462373B2

United States Patent
Kim et al.

(10) Patent No.: US 11,462,373 B2
(45) Date of Patent: Oct. 4, 2022

(54) SWITCH APPARATUS FOR AUTOMOBILE

(71) Applicant: Mobase Electronics Co., Ltd., Suwon-si (KR)

(72) Inventors: Kiwon Kim, Gunpo-si (KR); Gyuho Kim, Ansan-si (KR); Sangkil Park, Seoul (KR); Seulgichan Her, Seoul (KR); Myungjin Song, Osan-si (KR)

(73) Assignee: MOBASE ELECTRONICS CO., LTD., Suwon-si (KR)

( * ) Notice: Subject to any disclaimer, the term of this patent is extended or adjusted under 35 U.S.C. 154(b) by 65 days.

(21) Appl. No.: 16/979,025

(22) PCT Filed: Aug. 28, 2018

(86) PCT No.: PCT/KR2018/009903
§ 371 (c)(1),
(2) Date: Sep. 8, 2020

(87) PCT Pub. No.: WO2019/172495
PCT Pub. Date: Sep. 12, 2019

(65) Prior Publication Data
US 2021/0057175 A1    Feb. 25, 2021

(30) Foreign Application Priority Data

Mar. 7, 2018 (KR) .................. 10-2018-0026646
Mar. 7, 2018 (KR) .................. 10-2018-0026649
(Continued)

(51) Int. Cl.
*H01H 19/14* (2006.01)
*H01H 13/06* (2006.01)
(Continued)

(52) U.S. Cl.
CPC ............ *H01H 19/14* (2013.01); *H01H 13/06* (2013.01); *H01H 13/14* (2013.01);
(Continued)

(58) Field of Classification Search
CPC ........ H01H 19/14; H01H 13/06; H01H 13/14; H01H 19/025; H01H 25/06;
(Continued)

(56) References Cited

U.S. PATENT DOCUMENTS

2008/0174572 A1    7/2008   Katsuta et al.

FOREIGN PATENT DOCUMENTS

CN          206819327   * 12/2017   ............. H01H 19/00
JP          2008-177090 A    7/2008
(Continued)

*Primary Examiner* — Ahmed M Saeed
(74) *Attorney, Agent, or Firm* — Birch, Stewart, Kolasch & Birch, LLP

(57) ABSTRACT

A switch apparatus for an automobile with a reduced size by installing a touch type switch apparatus inside a dial switch apparatus is provided. A switch apparatus for an automobile according to the present disclosure includes a main body which has an open lower side, a cover body which is inserted into the open lower side of the main body and is coupled to the main body, a dial switch apparatus which is installed on the main body and has an annular wheel knob rotatable with a virtual rotation axis disposed in a vertical direction as a rotation center, a touch type switch apparatus which is installed on the main body and has a capacitive touch pad which is touched by a user and pressed in an up-down direction, a main PCB which is coupled to the cover body to be disposed in the main body and into which a switch signal is input from the dial switch apparatus and the touch type switch apparatus, and a case body which is coupled to the main body and has a hole, through which the wheel knob and the capacitive touch pad are exposed, on an upper side, in
(Continued)

which the capacitive touch pad is disposed inside the wheel knob.

19 Claims, 28 Drawing Sheets

(30) Foreign Application Priority Data

| | | |
|---|---|---|
| Mar. 9, 2018 | (KR) | 10-2018-0028198 |
| Mar. 9, 2018 | (KR) | 10-2018-0028208 |
| Mar. 9, 2018 | (KR) | 10-2018-0028214 |
| Mar. 9, 2018 | (KR) | 10-2018-0028221 |
| Mar. 9, 2018 | (KR) | 10-2018-0028224 |
| Mar. 15, 2018 | (KR) | 10-2018-0030348 |
| Mar. 20, 2018 | (KR) | 10-2018-0032243 |
| Mar. 28, 2018 | (KR) | 10-2018-0035813 |

(51) Int. Cl.
| | |
|---|---|
| *H01H 13/14* | (2006.01) |
| *H01H 19/02* | (2006.01) |
| *H01H 25/06* | (2006.01) |
| *H03K 17/96* | (2006.01) |

(52) U.S. Cl.
CPC .......... *H01H 19/025* (2013.01); *H01H 25/06* (2013.01); *H03K 17/962* (2013.01); *H01H 2219/036* (2013.01); *H01H 2231/026* (2013.01)

(58) Field of Classification Search
CPC ....... H01H 2219/036; H01H 2231/026; H01H 19/11; H03K 17/962; H03K 2217/96042; B60K 35/00; B60K 2370/126; B60K 2370/137; B60K 2370/1434; B60K 2370/341; B60K 2370/91; B60K 37/06; G06F 3/016; G06F 3/03547
See application file for complete search history.

(56) References Cited

FOREIGN PATENT DOCUMENTS

| | | | | |
|---|---|---|---|---|
| JP | 2015-165474 A | | 9/2015 | |
| KR | 10-0835142 B1 | | 6/2008 | |
| KR | 10-2008-0105432 A | | 12/2008 | |
| KR | 10-2009-0056463 A | | 6/2009 | |
| KR | 10-2009-0113470 A | | 11/2009 | |
| KR | 10-1451183 B1 | | 10/2014 | |
| KR | 10-1781345 B1 | | 9/2017 | |
| KR | 20170121808 | * | 11/2017 | ............. H01H 13/14 |
| KR | 20180042517 | * | 4/2018 | ............. H01H 19/00 |

* cited by examiner

SWITCH APPARATUS FOR AUTOMOBILE

BACKGROUND OF THE DISCLOSURE

Field of the Disclosure

The present disclosure relates to a switch apparatus for an automobile, and more particularly, to a switch apparatus for an automobile in which a plurality of switch apparatuses are installed in one body.

Related Art

In general, various switch apparatuses are installed in an interior of an automobile, and the switches are classified in various ways according to an operation method of a knob provided in a switch signal input unit. That is, the switches are classified into a push switch apparatus in which a knob is linearly moved by pushing of a user to generate different switch signals according to a linear movement amount of the knob, a seesaw switch apparatus in which the knob is rotated in one direction about a horizontally disposed rotating shaft to generate a first switch signal and the knob is rotated in the other direction to generate a second switch signal, and a rotary switch apparatus in which the knob is rotated about a rotating shaft to generate different switch signals according to a rotation angle of the knob.

Further, the rotary switch apparatus is classified into a dial switch apparatus, a joystick switch apparatus, and a scroll switch apparatus according to a shape of the knob.

In addition, in the above switch apparatuses, an operation method for inputting a switch signal was a mechanical input method in which a user applies a predetermined force, but recently, a touch type switch apparatus which is operated according to a touch input of a user has been developed actively.

The touch type switch apparatus includes a capacitive touch pad which is a component in which a user touches with a finger, and the capacitive touch pad is touched by the user so that a touch signal is input.

Meanwhile, recently, the switch apparatuses are installed in a single main body to form a multifunctional integrated switch apparatus. However, in the multifunctional integrated switch apparatus, since a plurality of switch apparatuses are installed in one body, it is necessary to maximize space utilization to reduce a size.

SUMMARY

A problem to be solved by the present disclosure is to provide a switch apparatus for an automobile with a reduced size by installing a touch type switch apparatus inside a dial switch apparatus.

In the related art, the switch apparatus is not formed in an annular shape. Accordingly, there is no inner space, and thus, a space for installing the touch type switch apparatus is not secured. An object of the present disclosure is to solve the problems.

An object of the present disclosure is not limited to the object mentioned above, and other objects which are not mentioned will be clearly understood by a person skilled in the art from the following description.

In order to achieve the object, according to the present disclosure, there is provided a switch apparatus for an automobile, including: a main body which has an open lower side; a cover body which is inserted into the open lower side of the main body and is coupled to the main body; a dial switch apparatus which is installed on the main body and has an annular wheel knob rotatable with a virtual rotation axis disposed in a vertical direction as a rotation center; a touch type switch apparatus which is installed on the main body and has a capacitive touch pad which is touched by a user and pressed in an up-down direction; a main PCB which is coupled to the cover body to be disposed in the main body and into which a switch signal is input from the dial switch apparatus and the touch type switch apparatus; and a case body which is coupled to the main body and has a hole, through which the wheel knob and the capacitive touch pad are exposed, on an upper side, in which the capacitive touch pad is disposed inside the wheel knob.

A first installation rib may be formed to protrude from an upper surface of the main body, and an input unit insertion groove into which a lower portion of the dial switch apparatus and a lower portion of the touch type switch apparatus are inserted may be formed inside the first installation rib, a first drain rib may be formed to protrude downward from the main body, and a first drain hole extending downward from a bottom surface of the input unit insertion groove may be formed inside the first drain rib, the main PCB may include a through hole through which the first drain rib passes, and a second drain rib may be formed to protrude upward from the cover body, and a second drain hole into which the first drain rib is inserted may be formed inside the second drain rib.

The second drain rib may support a lower surface of the main PCB.

A second installation rib which surrounds the first installation rib and forms a ring insertion groove between the first installation rib and the second installation rib may be further formed on an upper surface of the main body, and the switch apparatus may further include a mood ring of which a lower portion is inserted into the ring insertion groove and an upper portion protrudes from the ring insertion groove to surround the dial switch apparatus, the mood ring being illuminated by light generated by a light source provided in the main PCB.

The switch apparatus may further include a mood ring cover which surrounds an outer periphery of the second installation rib and an outer periphery of the mood ring protruding from the ring insertion groove and is coupled to the main body, in which an upper end of the mood ring may be disposed to be higher than an upper end of the mood ring cover so that a periphery of the upper end of the mood ring is surround by the case body.

A bottom surface of the ring insertion groove may include a transparent portion which is formed of a transparent material through which the light passes.

The bottom surface of the ring insertion groove may further include a non-transparent portion which is formed of an opaque material through which the light does not pass, and the transparent portion and the non-transparent portion may be alternately formed along a circumferential direction.

The transparent portion may be double-injection molded with the main body.

The switch apparatus may further include an insert which is formed of a transparent material and is inserted into a mold when the main body is molded in the mold to form the transparent portion, in which the insert may include a ring portion having a shape corresponding to the bottom surface of the ring insertion groove and a transparent portion generating protrusion protruding from a lower surface of the ring portion, and the transparent portion may be a portion of the ring portion in which the transparent portion generating protrusion is formed.

A groove may be formed on a lower surface of the transparent portion generating protrusion.

The mood ring may include a lower end portion which is inserted into the ring insertion groove, an intermediate portion which extends upward from an upper end of the lower end portion and has an outer diameter smaller than that of the lower end portion, and an upper end portion which extends upward from an upper end of the intermediate portion and has an outer diameter smaller than that of the intermediate portion, the mood ring cover may be seated on a stair between the lower end portion and the intermediate portion to surround peripheries of the intermediate portion and the second installation rib and is coupled to the main body, and the case body may be seated on a stair between the intermediate portion and the upper end portion to surround a periphery of the upper end portion and is coupled to the main body.

The switch apparatus may further include a scroll switch apparatus which is installed on the main body and has a scroll switch knob rotatable with a rotating shaft disposed in a horizontal direction as a rotation center, in which a switch signal from the scroll switch apparatus may be further input to the main PCB, and a hole through which the scroll switch knob is exposed may be formed on an upper side of the case body.

The switch apparatus may further include a push switch apparatus which is installed on the main body and has a push button pressed in the up-down direction by the user, in which a switch signal from the push switch apparatus may be further input to the main PCB, and a hole through which the push button is exposed may be formed on the upper side of the case body.

The touch type switch apparatus may further include a PCB to which a touch signal of the capacitive touch pad is input, a case which has open upper side and lower side and the open upper side covered with capacitive touch pad and into which the PCB is inserted, a cover which is inserted into the open lower side of the case to cover the open lower side of the case, is coupled to the case, and in which an actuator vibrating in a horizontal direction during operation is installed, and a base which is installed below the cover to be coupled to the cover, has a hinge shaft disposed in the horizontal direction, is rotatable up and down with the hinge shaft as a rotation center, and has a lower surface from which a pusher portion is formed to protrude, and when the base is rotated downward with the hinge shaft as the rotation center, the pusher portion may contact a switch provided on an upper surface of the main PCB to operate the actuator.

The cover and the base may be spaced apart from each other, and the switch apparatus may further include an elastic member which couples the cover and the base to each other and provides an elastic force in the horizontal direction to the base when the base is vibrated in the horizontal direction by the operation of the actuator.

A mounting protrusion extending to a side surface of the base may be formed on a lower surface of the cover, and the elastic member may be a leaf spring in which an upper end and a lower end thereof are bent, the upper end may be coupled to an upper surface of the base, and the lower end may be coupled to a lower surface of the mounting protrusion.

An accommodation protrusion in which the actuator is accommodated may be formed to protrude from a lower surface of the cover, and the base may include an insertion hole into which accommodation protrusion is inserted.

The hinge shaft may be disposed radially outside the capacitive touch pad and the case.

After a lower surface of the capacitive touch pad is shielded and painted to prevent light leakage, the upper surface of the PCB may be vacuum-adhered to the lower surface of the capacitive touch pad through an adhesive.

The capacitive touch pad may include a plastic portion which is molded with an acrylic resin, anti-glare portion which is coated on an upper surface of the plastic portion, and an anti-fingerprint portion which is coated on an upper surface of the anti-glare portion, and in the capacitive touch pad, after the anti-glare portion is coated on the upper surface of the plastic portion and the anti-fingerprint portion is coated on the upper surface of the anti-glare portion, the reinforcement heat treatment may be performed to secure a hardness.

A light source may be disposed on a lower surface of the PCB, a first stair portion which protrudes in a radial direction and has an upper surface formed in a horizontal plane and in which the PCB is seated on the upper surface, and a second stair portion which protrudes in the radial direction from a lower portion of the first stair portion, has an upper surface formed in a horizontal plane, and extends to a lower side of the light source may be formed inside the case, and the second stair portion may guide light to the first stair portion and the outside of the case to illuminate the case while being illuminated by light emitted by the light source.

The cover may include an edge rib protruding upward along an upper edge, and an insertion groove into which the edge rib is inserted may be formed in the first stair portion.

A surface connecting the upper surface of the first stair portion and the upper surface of the second stair portion to each other may include a first inclined surface, a vertical surface, and a second inclined surface, and the vertical surface may connect between the first inclined surface and the second inclined surface.

The dial switch apparatus may further include an annular inner wheel, an annular outer wheel which is coupled to an outer periphery of the inner wheel to be rotatable in a circumferential direction and to which the wheel knob is coupled, and an annular wheel base which is disposed below the inner wheel and the outer wheel so that the inner wheel is coupled to the wheel base to be movable up and down and has a pusher portion formed to protrude from a lower surface, the wheel knob may cover upper sides of the inner wheel and the outer wheel, and when the wheel knob is pressed downward, the pusher portion may contact a switch provided on an upper surface of the main PCB.

A magnet may be inserted into a lower surface of the outer wheel, and a Hall sensor which detects rotation angles of the wheel knob and the outer wheel in response to the magnet may be provided in the wheel base.

An accommodation groove may be formed on an upper surface of the wheel base, and the switch apparatus may further include: an elastic member which is accommodated in the accommodation groove; and a support member which is elastically supported by the elastic member, is disposed in the accommodation groove so as to be movable up and down, and has an upper end which protrudes upward from the wheel base through the accommodation groove to support the inner wheel.

A hook hole communicating vertically is formed on an upper surface of the wheel base at a position corresponding to the pusher portion, and a hook portion which is inserted into the hook hole and couples the inner wheel to the wheel base so as to be movable up and down may be formed to protrude downward from the inner wheel.

When the wheel knob is pressed downward, the inner wheel may be rotated in the up-down direction with the hook portion as a rotation center.

A protrusion and a groove may be alternately formed on an inner peripheral surface of the outer wheel along the circumferential direction, and the inner wheel may include a detent which rides over the protrusion and the groove when the outer wheel is rotated along the circumferential direction and a detent elastic member which elastically supports the detent.

The switch apparatus may further include a bearing which is disposed between an outer peripheral surface of the inner wheel and an inner peripheral surface of the outer wheel and rotatably couples the outer wheel to the inner wheel.

The scroll switch apparatus may further include a knob holder which shields an open upper end of an installation portion outside the installation portion formed to protrude from the upper surface of the main body and is installed in the installation portion to be linearly movable and has a pusher portion inserted into the installation portion, and to which the scroll switch knob is rotatably coupled, and a sensor shaft which is rotatably coupled to the knob holder in the circumferential direction to be rotated by a rotational force of the scroll switch knob and has a detection unit at a portion inserted into the main body, the rotating shaft disposed in the horizontal direction may be formed to protrude in an axial direction from the scroll switch knob, and the main PCB may include a sensor which detects a circumferential rotation angle of the detection unit when the sensor shaft is rotated in the circumferential direction and a switch which is contacted by the pusher portion when the knob holder moves linearly.

The knob holder may include an upper surface portion which covers the open upper end of the installation portion, and a side surface portion which extends downward from an edge of the upper surface portion to cover a portion of a side surface of the installation portion, the pusher portion may be spaced apart from an inside of the side surface portion and extends downward from a lower surface of the upper surface portion, the open upper end of the installation portion may be inserted into between the side surface portion and the pusher portion, a first insertion rib and a second insertion rib which are spaced apart from each other in the axial direction may be formed to protrude from the upper surface portion, the scroll switch knob may be inserted into between the first insertion rib and the second insertion rib, and the rotating shaft disposed in the horizontal direction may be rotatably coupled to at least one of coupling ribs respectively formed in the first insertion rib and the second insertion rib.

A portion of the scroll switch knob in the radial direction may be disposed to protrude upward from the first insertion rib and the second insertion rib, and each of the first insertion rib and the second insertion rib may be formed in a rectangular shape having an open side in the axial direction, and the open one side of the first insertion rib and the open one side of the second insertion rib may be disposed to face each other.

A knob gear disposed outside the knob holder may be formed on the rotating shaft disposed in the horizontal direction, a first gear rotated by a rotational force of the knob gear may be formed in a portion of the sensor shaft disposed outside the knob holder, and a second gear may be further provided, which is formed to have a diameter larger than those of the knob gear and the first gear to engage with the knob gear and the first gear, and is rotatably coupled to the knob holder to be disposed outside the knob holder.

The scroll switch knob may include a detent holder which is formed to be elongated in the axial direction, a scroll knob body which is formed to be elongated in the axial direction so that the detent holder is inserted into the scroll knob body to be elongated in the axial direction and is provided in the circumferential direction to be rotatable with respect to the detent holder, an elastic member which is inserted into the scroll knob body and is installed in the detent holder, a detent which is inserted into the scroll knob body, is elastically supported by the elastic member, and is installed in the detent holder to be movable in the axial direction, and a cam member which is coupled to the scroll knob body to be rotated together with the scroll knob body and in which a vibration generating protrusion and a vibration generating groove over which the detent rides when the scroll knob body rotates are alternately formed on one surface facing the detent holder along the circumferential direction.

A rotating shaft rotatably coupled to a switch body may be formed to protrude from the other surface of the cam member, and the scroll knob body may be provided to be rotatable with the rotating shaft as a rotation center.

The scroll knob body may include a through hole which is formed on one surface which is a surface opposite to the rotating shaft, and a rotation prevention protrusion which passes through the through hole and is coupled to the switch body so as not to be rotated in the circumferential direction may be formed on one surface of the detent holder.

An insertion groove into which the elastic member and the detent are inserted may be formed on the other surface of the detent holder.

A plurality of insertion grooves, a plurality of elastic members, and a plurality of detents may be provided.

A center groove may be formed at a center of the other surface of the detent holder, and a center shaft which is inserted into the center groove and is rotatably disposed may be formed to protrude from a center of one surface of the cam member.

The cam member may be inserted into the scroll knob body, and a coupling groove may be formed in any one of an inner peripheral surface of the scroll knob body and an outer peripheral surface of the cam member, and a coupling protrusion which is inserted into the coupling groove to be coupled may be formed in the other.

Details of other embodiments are included in the detailed description and drawings.

Advantageous Effects

In the switch apparatus for an automobile according to the present disclosure, the wheel knob of the dial switch apparatus is formed in an annular shape, and the capacitive touch pad of the touch type switch apparatus is disposed in the inner space of the wheel knob. Accordingly, the touch type switch apparatus is installed inside the dial switch apparatus, and thus, a size thereof can be reduced.

Moreover, the first drain rib is formed in the main body, the through hole is formed in the main PCB, and the second drain rib is formed in the cover body. The first drain rib passes through the through hole and is inserted into the second drain rib. The first drain hole extending downward from the bottom surface of the input unit insertion groove is formed inside the first drain rib, and the second drain hole into which the first drain rib is inserted is formed inside the second drain rib. Accordingly, when moisture is introduced into the input unit insertion groove through the dial switch apparatus and the touch type switch apparatus, the introduced moisture is discharged to the lower side of the cover body through the first drain hole and the second drain hole. Therefore, there is no need to provide a drainage structure outside the periphery of the main PCB in the main body, and thus, a size of the main body can be reduced.

The ring insertion groove into which the lower end of the mood ring is inserted is formed in the main body, and the transparent portion through which light generated by the light source passes and which is formed of a transparent material is formed on the bottom surface of the ring insertion groove. Accordingly, the mood ring can be illuminated by the light, and it is possible to prevent external moisture from directly flowing into the main PCT through the mood ring.

Moreover, the case of the touch type switch apparatus is illuminated, and thus, a user can recognize a position of the capacitive touch pad through subtle light emitted from the case and emotions of the user can be improved.

Effects of the present disclosure are not limited to the above-mentioned effects, and other effects not mentioned will be clearly understood by a person skilled in the art from the description of the claims.

DESCRIPTION OF EXEMPLARY EMBODIMENTS

Figure 1:
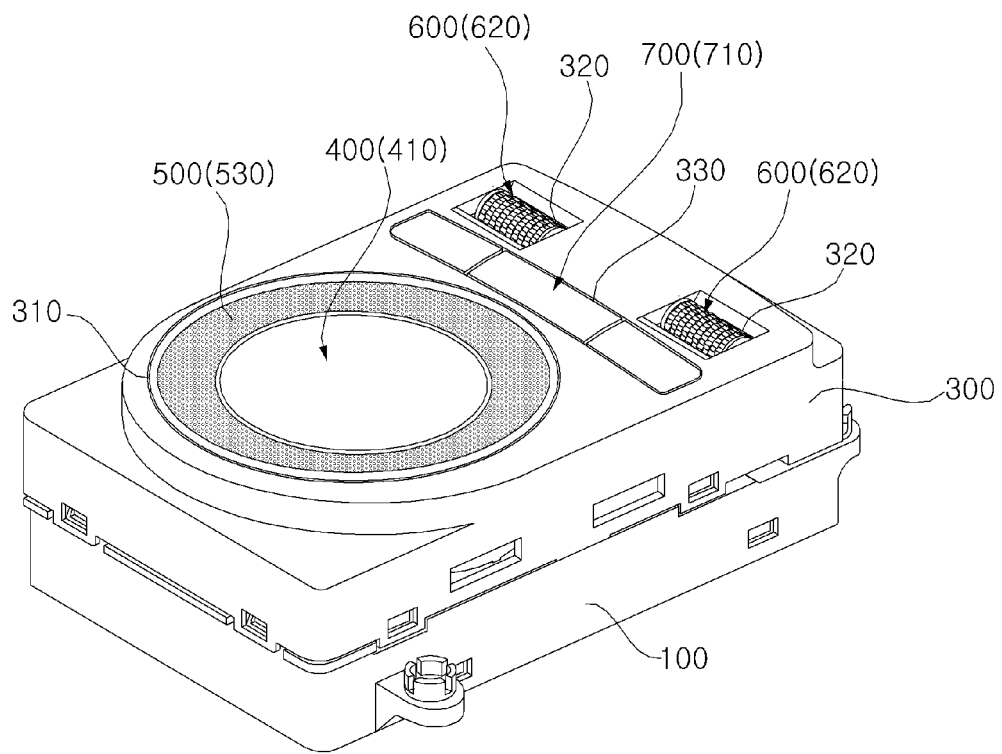
FIG. 1 is a combined perspective view illustrating a switch apparatus for an automobile according to an embodiment of the present disclosure.

Advantages and features of the present disclosure, and a method of achieving the advantages and features will become apparent with reference to embodiments described below in detail with the accompanying drawings. However, the present disclosure is not limited to the embodiments disclosed below, but may be implemented in a variety of different forms. The embodiments are provided to ensure that the disclosure of the present disclosure is complete, and to fully inform the scope of the invention to those with ordinary skill in the technical field to which the present disclosure belongs, and the present disclosure is only defined by the scope of the claims. The same reference numerals refer to the same components throughout the specification.

Hereinafter, a switch apparatus for an automobile according to an embodiment of the present disclosure will be described with reference to the drawings.

Figure 2:
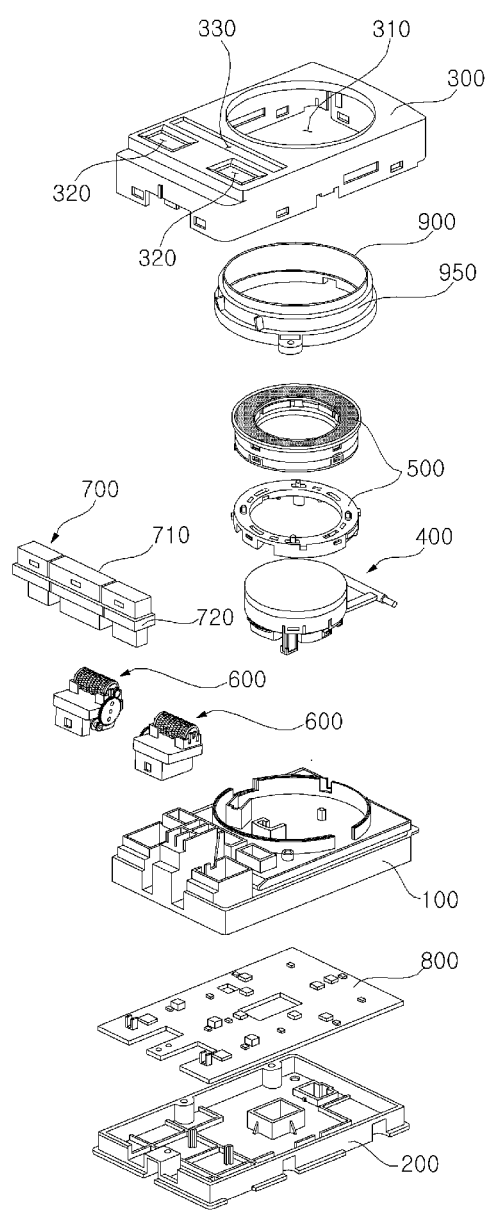
FIG. 2 is an exploded perspective view illustrating the switch apparatus for an automobile according to the embodiment of the present disclosure.
Figure 3:
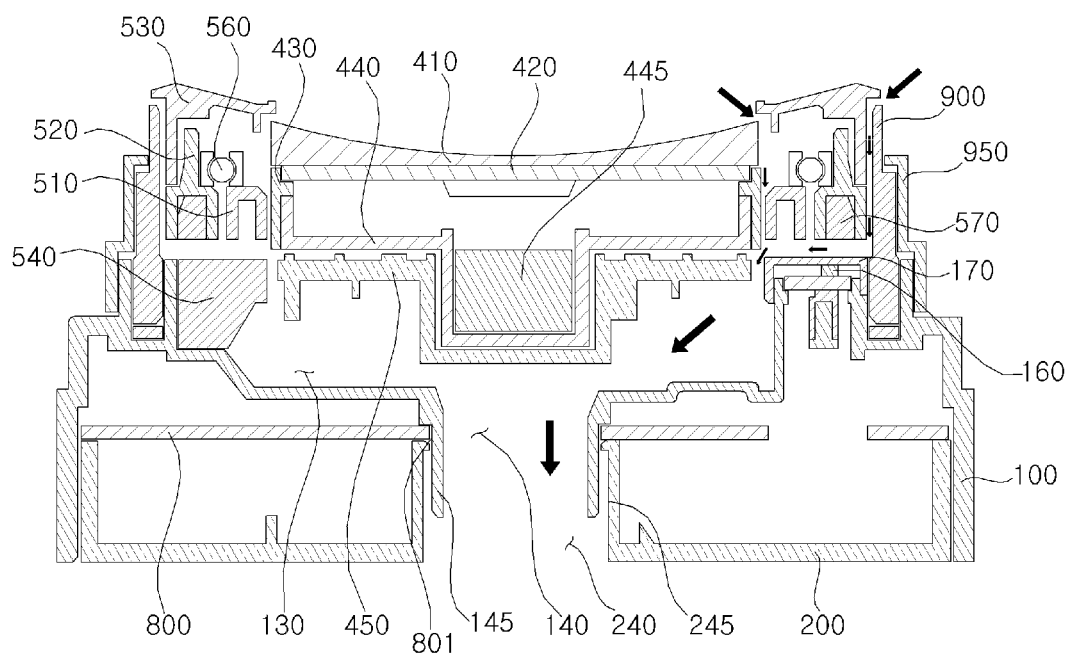
FIG. 3 is a side cross-sectional view of a portion in which a touch type switch apparatus and a dial switch apparatus are installed, excluding a case body in FIG. 1.
Figure 4:
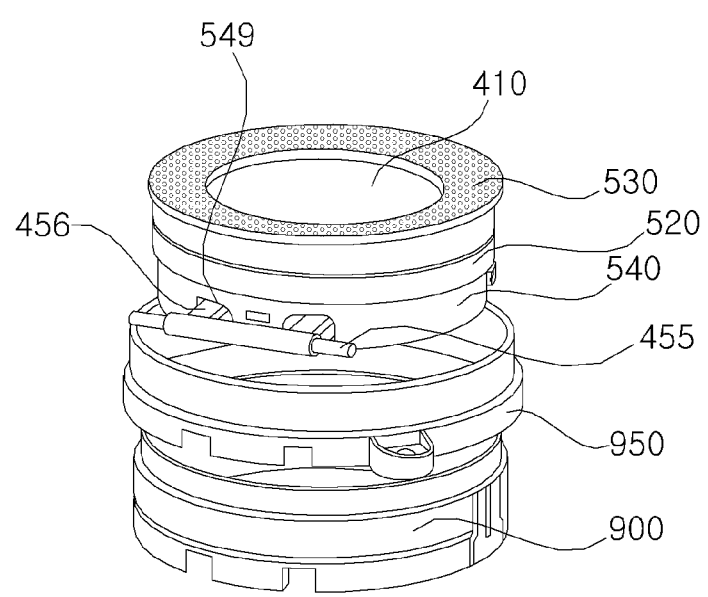
FIG. 4 is an exploded perspective view illustrating a capacitive touch pad, a wheel knob, an outer wheel, and a wheel base illustrated in FIG. 3.
Figure 5:
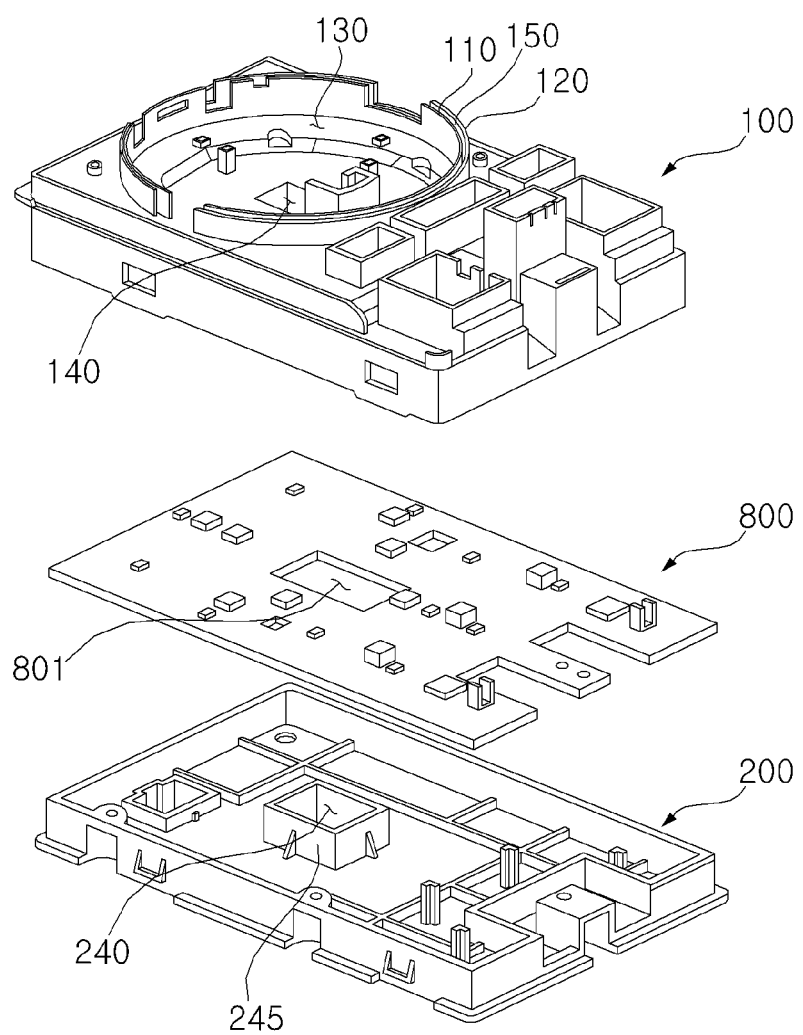
FIG. 5 is an exploded perspective view illustrating a main body, a main PCB, and a cover body illustrated in FIG. 3.

FIG. 1 is a combined perspective view illustrating a switch apparatus for an automobile according to an embodiment of the present disclosure, FIG. 2 is an exploded perspective view illustrating the switch apparatus for an automobile according to the embodiment of the present disclosure, FIG. 3 is a side cross-sectional view of a portion in which a touch type switch apparatus and a dial switch apparatus are installed, excluding a case body in FIG. 1, FIG. 4 is an exploded perspective view illustrating a capacitive touch pad, a wheel knob, an outer wheel, and a wheel base illustrated in FIG. 3, and FIG. 5 is an exploded perspective view illustrating a main body, a main PCB, and a cover body illustrated in FIG. 3.

Referring to FIGS. 1 to 5, the switch apparatus for an automobile according to the present disclosure includes a main body 100, a cover body 200, a case body 300, a touch type switch apparatus 400, a dial switch apparatus 500, a scroll switch apparatus 600, and a push switch apparatus 700.

Each of the main body 100, the cover body 200, and the case body 300 is formed in a rectangular shape.

The main body 100 has an open lower side, and the cover body 200 is inserted into the open lower side of the main body 100 to be coupled to the main body 100. When the cover body 200 is inserted into the open lower side of the main body 100, the open lower side of the main body 100 may be covered by the cover body 200.

After a main PCB (printed circuit board) 800 is coupled to the cover body 200, the cover body 200 may be inserted into the open lower side of the main body 100. Accordingly, when the cover body 200 is inserted into the open lower side of the main body 100, the main PCB 800 may be disposed in the main body 100. Switch signals from the touch type switch apparatus 400, the dial switch apparatus 500, the scroll switch apparatus 600, and the push switch apparatus 700 may be input to the main PCB 800.

The touch type switch apparatus 400, the dial switch apparatus 500, the scroll switch apparatus 600, and the push switch apparatus 700 are installed on the main body 100, respectively.

The touch type switch apparatus 400 may have a capacitive touch pad 410 which is touched by a user and pressed in an up-down direction.

The dial switch apparatus 500 may have an annular wheel knob 530 capable of rotating with a virtual rotation axis disposed in a vertical direction as a rotation center. As the wheel knob 530 is formed in an annular shape, the capacitive touch pad 410 is disposed inside the wheel knob 530. Accordingly, in the switch apparatus for an automobile according to the embodiment of the present disclosure, the touch type switch apparatus 400 is installed in an inner space of the dial switch apparatus 500, and thus, a size thereof can be reduced. The wheel knob 530 is disposed to surround an outer periphery of the capacitive touch pad 410 and can be rotated in a circumferential direction by an operation of a user.

The scroll switch apparatus 600 may have a scroll switch knob 620 capable of rotating with a rotating shaft 627A disposed in a horizontal direction as a rotation center.

A plurality of scroll switch apparatuses 600 may be installed in the main body 100, and in the present embodiment, two scroll switch apparatuses 600 are installed in the main body 100.

The push switch apparatus 700 may have a push button 710 which is pressed in the up-down direction by the user. The push switch apparatus 700 may include a plurality of push buttons 710 and a plurality of button holders 720 to which the plurality of push buttons 710 are respectively coupled. In the present embodiment, three push buttons 710 are provided, and three button holders 720 are provided, and thus, one push button 710 may be installed per button holder 720. A lower portion of the push button 710 may be inserted into the button holder 720 from above the button holder 720 to be coupled to the button holder 720.

The button holder 720 may be inserted into an installation portion protruding upwardly on an upper surface of the main body 100 and installed so as to be movable up and down, and when the upper surface of the push button 710 is pressed downward by the user, the button holder 720 may be moved downward to contact a switch provided in the main PCB 800. Accordingly, when the switch is contacted, the main PCB 800 may generate a switch signal. The push switch apparatus 700 included in the switch apparatus for an automobile according to the embodiment of the present disclosure has already been disclosed, and thus, detailed description thereof will be omitted below.

The case body 300 may cover the upper side of the main body 100 to be coupled to the main body 100. A hole 310 through which the wheel knob 530 and the capacitive touch pad 410 are exposed, a hole 320 through which the scroll switch knob 620 is exposed, and a hole 330 through which the push button 710 is exposed may be formed on the upper side of the case body 300.

A surface of the case body 300 may be formed of a metal material. In the present embodiment, the metal material is chromium. That is, the surface of the case body 300 is plated with chromium, and thus, may have an approximately silvery color. A surface of the wheel knob 530 may be formed of the same metal material as that of the surface of the case body 300. That is, the surface of the wheel knob 530 is plated with chrome, and thus, may have an approximately silvery color. A surface of the scroll switch knob 620 may be formed of the same metal material as that of the surface of the case body 300. That is, the surface of the scroll switch knob 620 is plated with chrome, and thus, may have an approximately silvery color.

Meanwhile, in the main body 100, a drainage structure is formed in a portion where the touch type switch apparatus 400 and the dial switch apparatus 500 are installed. The drainage structure will be described below.

A first installation rib 110 and a second installation rib 120 are respectively formed on an upper surface of the main body 100 to protrude upward. Each of the first installation rib 110 and the second installation rib 120 may be formed in an annular shape, and at least one side thereof may be open. The second installation rib 120 has a larger diameter than that of the first installation rib 110 and may surround the first installation rib 110.

The first installation rib 110 forms an input unit insertion groove 130 therein. A lower portion of the dial switch apparatus 500 and a lower portion of the touch type switch apparatus 400 are inserted into the input unit insertion groove 130 and installed in the main body 100. The main PCB 800 may receive a switch signal from the dial switch apparatus 500 and the touch type switch apparatus 400.

In the main body 100, a first drain rib 145 is formed to protrude downward. The first drain rib 145 forms a first drain hole 140 extending downward from a bottom surface of the input unit insertion groove 130 therein. Further, a through hole 801 through which the first drain rib 145 passes is formed in the main PCB 800. In addition, a second drain rib is formed in the cover body 200 so as to protrude upward. The second drain rib 245 forms a second drain hole 240 into which the first drain rib 145 is inserted therein. Each of the first drain rib 145, the through hole 801, and the second drain rib 245 is formed in a rectangular shape. Moisture introduced into the input unit insertion groove 130 through the upper sides of the dial switch apparatus 500 and the touch type switch apparatus 400 may pass through the first drain hole 140 formed on the bottom surface of the input unit insertion groove 130 and the second drain hole 240 formed in the cover body 200 and may be discharged to the outside of the cover body 200 through the lower side of the cover body 200. In this way, the moisture may not enter the main PCB 800 through the drainage structure.

The second drain rib 245 may support the lower surface of the main PCB 800. An upper end of the second drain rib 245 may be in contact with the lower surface of the main PCB 800.

The dial switch apparatus 500 may further include an inner wheel 510, an outer wheel 520, a bearing 560, and a wheel base 540.

Each of the inner wheel 510, the outer wheel 520, the bearing 560, and the wheel base 540 may be formed in an annular shape. Each of the wheel knob 530, the inner wheel 510, the outer wheel 520, and the wheel base 540 is formed in an annular shape, sand thus, the touch type switch apparatus 400 may be disposed inside the dial switch apparatus 500.

The outer wheel 520 surrounds an outer periphery of the inner wheel 510 and is disposed to be rotated in the circumferential direction with respect to the inner wheel 510. The outer wheel 520 may be rotatably coupled to the outer periphery of the inner wheel 510 through the bearing 560 in the circumferential direction. The bearing 560 rotatably couples the outer wheel 520 to the inner wheel 510 in the circumferential direction. An inner ring of the bearing 560 is coupled to the inner wheel 510, an outer ring of the bearing 560 is coupled to the outer wheel 520, and thus, the bearing 560 can rotatably couple the outer wheel 520 to the inner wheel 510 in the circumferential direction.

The wheel base 540 may be disposed below the inner wheel 510 and the outer wheel 520. The wheel base 540 may be inserted into the input unit insertion groove 130 and installed in the main body 100. The inner wheel 510 may be fixedly installed in the wheel base 540 or may be installed in the wheel base 540 to be movable up and down.

A magnet 570 may be installed below the outer wheel 520, and a Hall sensor 160 which detects the magnet 570 when the wheel knob 530 rotates may be installed in the main body 100. The Hall sensor 160 may detect a rotation angle of the wheel knob 530 by detecting the magnet 570 when the wheel knob 530 rotates. The main PCB 800 may generate different switch signals according to the rotation angle of the wheel knob 530. A Hall sensor cover 170 which covers the Hall sensor 160 may be coupled to an upper surface of the main body 100. The Hall sensor cover 170 may cover the Hall sensor 160 to prevent the moisture from entering the Hall sensor 160.

The touch type switch apparatus 400 may further include a PCB 420, a case 430, a cover 440, and a base 450.

The PCB 420 may be adhered to a lower surface of the capacitive touch pad 410. An upper surface of the capacitive touch pad 410 may be formed to be concave and the lower surface thereof may be formed to be flat in the horizontal direction. The capacitive touch pad 410 may include a plurality of sensing cells in a grid shape. By detecting that a finger of the user passes through the plurality of sensing cells while touching the upper surface of the capacitive touch pad 410, a movement direction and a touch length of the finger of the user can be known, and a touch signal generated by the finger of the user touching the upper surface of the capacitive touch pad 410 may be input to the PCB 420.

Upper and lower surfaces of the case 430 may be open, respectively. The PCB 420 may be inserted into the case 430 through the opened upper surface of the case 430 and accommodated in the case 430. When the PCB 420 is accommodated inside the case 430, the PCB 420 is seated on the protrusion formed on the inner circumferential surface of the case 430, and the capacitive touch pad 410 may cover the opened upper surface of the case 430 and seated on an upper end of the case 430.

The cover 440 may cover the opened lower surface of the case 430 and may be coupled to the case 430. An upper portion of the cover 440 may be inserted into the case 430. An actuator 445 may be installed inside the cover 440. The actuator 445 may be vibrated during operation. The cover 440 may be vibrated together with the actuator 445 by the vibrations of the actuator 445. The actuator 445 may be provided to vibrate horizontally or may be provided to vibrate in a vertical direction.

The base 450 may be disposed below the cover 440 and installed in the input unit insertion groove 130. The cover 440 may be coupled to the base 450 so as to be shaken by the vibration. The cover 440 is coupled to the base 450 through a leaf spring (not illustrated), and thus, the cover can be shaken by the vibration.

A hinge shaft 455 may be formed in the base 450. The hinge shaft 455 may be disposed horizontally outside the dial switch apparatus 500 in a radial direction. When the user presses the upper surface of the capacitive touch pad 410 downward, the base 450 may be rotated about the hinge shaft 455, and a pusher portion (not illustrated) provided to protrude toward the lower surface of the base 450 contact the switch provided in the main PCB 800, the actuator 445 is operated to generate the vibrations, and thus, the user can feel feedback by the generated vibrations.

The hinge shaft 455 may be formed at an end of a bridge 456 protruding from the base 450 in the radial direction. The hinge shaft 455 may be elongated in a direction orthogonal to a length direction of the bridge 456. The hinge shaft 455 may be formed to be long in the horizontal direction. A plurality of bridges 456 may be formed, and in the present embodiment, two bridges 456 are formed. The bridge 456 may connect the base 450 and the hinge shaft 455 to each other. A through hole 549 through which the bridge 456 passes in the radial direction may be formed in the wheel base 540 of the dial switch apparatus 500, and the hinge shaft 455 may be disposed outside the wheel base 540.

Meanwhile, a ring insertion groove 150 may be formed inside the second installation rib 120. A mood ring 900 may be installed on the upper surface of the main body 100. A lower portion of the mood ring 900 may be inserted into the ring insertion groove 150 formed on the upper surface of the main body 100, and an upper portion of the mood ring 900 protrudes upward from the ring insertion groove 150 to surround the outer periphery of the dial switch apparatus 500. The upper portion of the mood ring 900 may be disposed to surround the outer periphery of the wheel knob 530. The mood ring 900 may be illuminated by light generated by a light source provided on the upper surface of the main PCB 800. The mood ring 900 is illuminated with a soft light, allows the user to recognize the position of the wheel knob 530, and makes the switch apparatus beautiful.

A mood ring cover 950 may be coupled to the main body 100. The mood ring cover 950 may surround an outer periphery of the mood ring 900. An outer peripheral surface of the mood ring 900 may be stepped in the up-down direction, and the mood ring cover 950 may be stepped in the up-down direction to surround the outer periphery of the stepped mood ring 900. An upper end of the mood ring 900 is disposed to protrude higher than am upper end of the mood ring cover 950 and the periphery of the mood ring 900 may be surrounded by the case body 300.

As described above, in the switch apparatus for an automobile according to the embodiment of the present disclosure, the first drain rib 145 is formed in the main body 100, the through hole 801 is formed in the main PCB 800, and the second drain rib 245 is formed in the cover body 200. The first drain rib 145 passes through the through hole 801 and is inserted into the second drain rib 245. The first drain hole 140 extending downward from the bottom surface of the input unit insertion groove 130 is formed inside the first drain rib 145, and the second drain hole 240 into which the first drain rib 145 is inserted is formed inside the second drain rib 245. Therefore, when moisture is introduced into the input unit insertion groove 130 through the dial switch apparatus 500 and the touch type switch apparatus 400, the introduced moisture is discharged to the lower side of the cover body 200 through the first drain hole 140 and the second drain hole 240. Accordingly, there is no need to provide a drainage structure outside the periphery of the main PCB 800 in the main body 100, and thus, a size of the main body 100 can be reduced.

In addition, the wheel knob 530 of the dial switch apparatus 500 is formed in an annular shape, and surrounds the outer periphery of the capacitive touch pad 410 of the touch type switch apparatus 400. Therefore, the touch type switch apparatus 400 is installed inside the dial switch apparatus 500, and thus, a space in the main body 100 for installing the touch type switch apparatus 400 and the dial switch apparatus 500 can be reduced, and the size of the main body 100 can be reduced.

Figure 6:
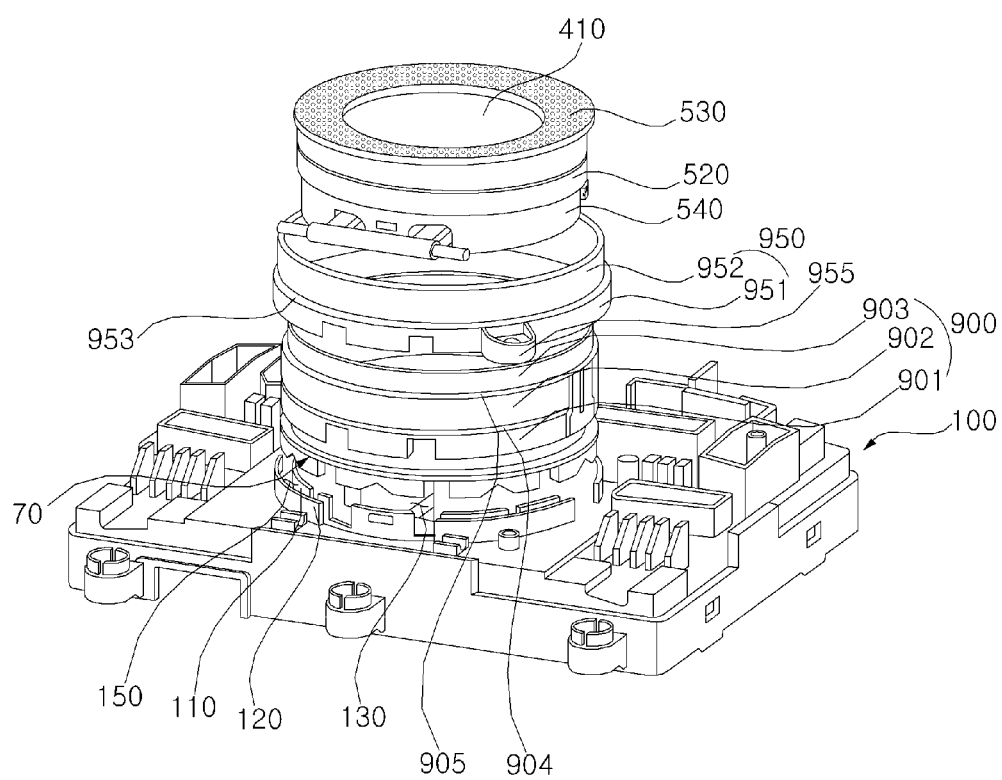
FIG. 6 is an exploded perspective view illustrating a switch apparatus for an automobile according to an embodiment of the present disclosure.
Figure 7:
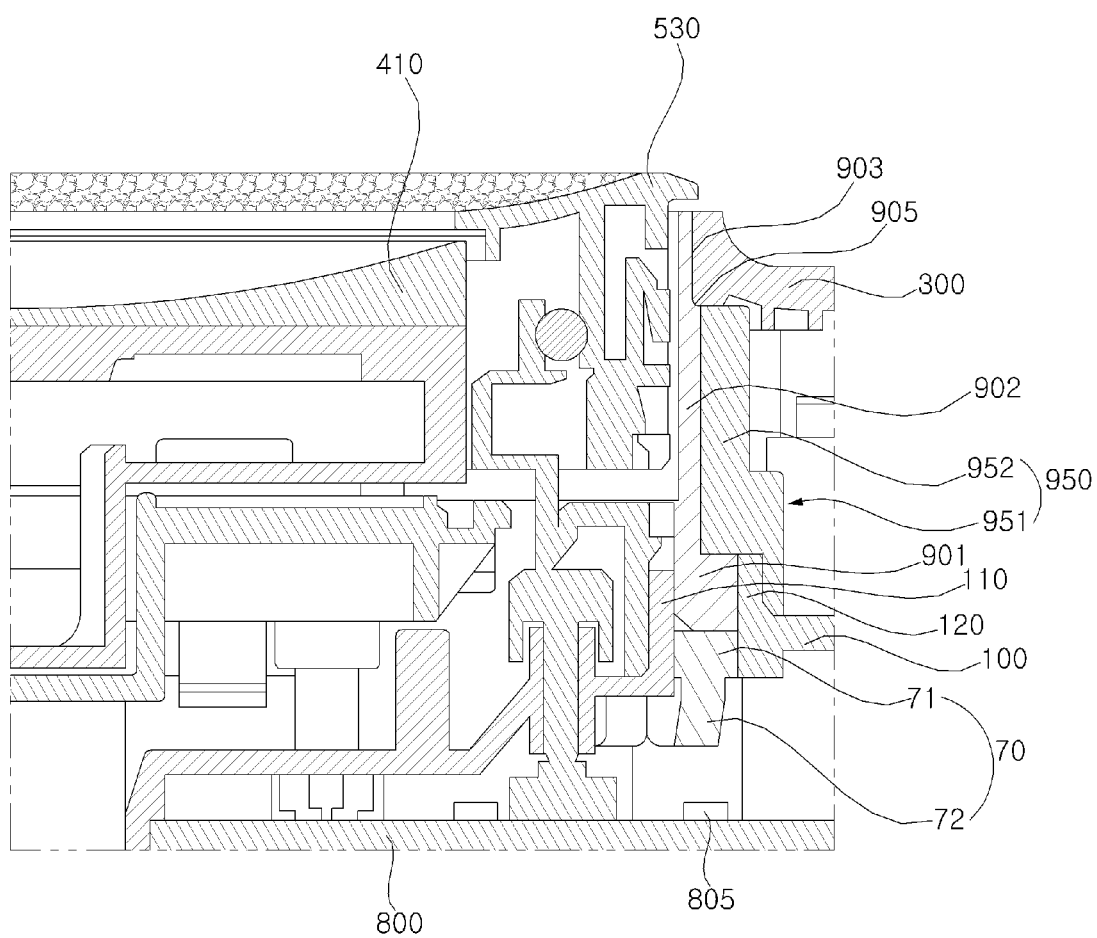
FIG. 7 is a one-side cross-sectional view of a combined state of the switch apparatus for an automobile illustrated in FIG. 6.
Figure 8:
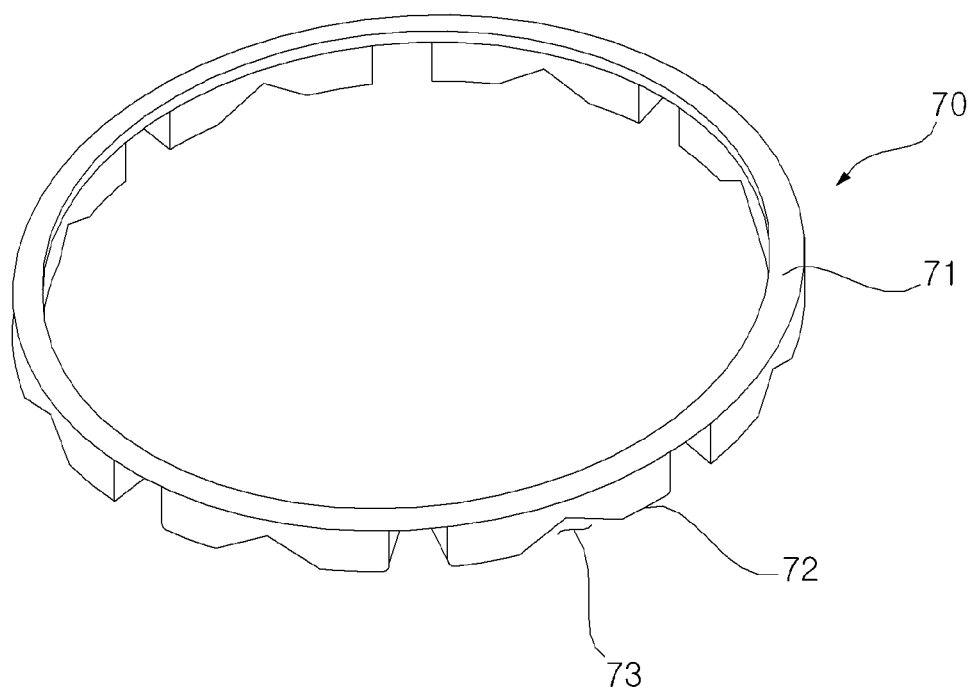
FIG. 8 is a perspective view illustrating an insert illustrated in FIG. 6.
Figure 9:
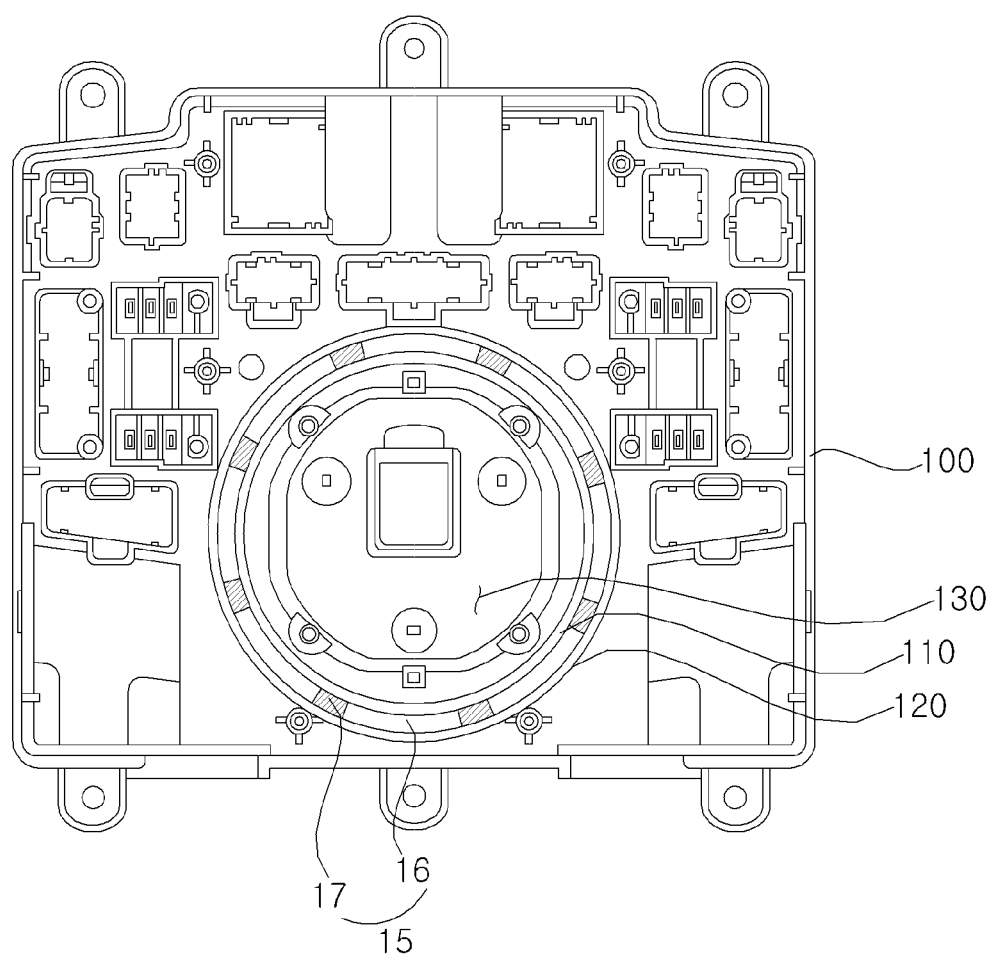
FIG. 9 is a plan view illustrating a state in which the main body and the insert are double-injection molded in a mold in FIG. 6.

FIG. 6 is an exploded perspective view illustrating a switch apparatus for an automobile according to an embodiment of the present disclosure, FIG. 7 is a one-side cross-sectional view of a combined state of the switch apparatus for an automobile illustrated in FIG. 6, FIG. 8 is a perspective view illustrating an insert illustrated in FIG. 6, and FIG. 9 is a plan view illustrating a state in which the main body and the insert are double-injection molded in a mold in FIG. 6.

Referring to FIGS. 6 to 9, a switch apparatus for an automobile according to an embodiment of the present disclosure further includes an insert 70. FIG. 6 illustrates that the insert 70 is separated from the main body 100 for understanding of the description. However, in practice, when the main body 100 is molded in a mold, the insert 70 is a structure which is inserted into the mold to form a transparent portion 16 described later and is formed of a transparent material which is double-injection molded with the main body 100, and after the molding of the main body 100 is completed, the insert 70 is integrally formed with the main body 100 and is not separated from the main body 100.

The first installation rib 110 and the second installation rib 120 spaced apart from each other are formed on the upper surface of the main body 100 to protrude upward. Each of the first installation rib 110 and the second installation rib 120 may be formed in an annular shape, and a hole or groove may be formed on at least one side of each rib. The input unit insertion groove 130 is formed inside the first installation rib 110, and the ring insertion groove 150 is formed between the first installation rib 110 and the second installation rib 120. That is, the input unit insertion groove 130 is formed inside the first installation rib 110, and the ring insertion groove 150 is formed between and the first installation rib 110 and the second installation rib 120.

The wheel knob 530 of the dial switch apparatus 500 is formed in an annular shape. The capacitive touch pad 410 of the touch type switch apparatus 400 is formed in a circular shape and is disposed inside the wheel knob 530 of the dial switch apparatus 500. The upper surface of the capacitive touch pad 410 of the touch type switch apparatus 400 may formed to be concave. The upper surface of the wheel knob 530 is formed to be inclined so that an outer end thereof is high and an inner end thereof is low, and thus, the upper surface may match the concave upper surface of the capacitive touch pad 410. A touch signal of the finger of the user is input to the capacitive touch pad 410. The user can write on the capacitive touch pad 410, and a touch signal which has been handwritten may be input to the main PCB 800. The dial switch apparatus 500 surrounds the outer periphery of the touch type switch apparatus 400. A rotation signal rotated in the circumferential direction and a push signal pushed in an axial direction are input to the dial switch apparatus 500. When the user holds and rotates the wheel knob 530 of the dial switch apparatus 500, different rotation signals may be input to the main PCB 800 according to the rotation angle of the wheel knob 530. In addition, when the user pushes the wheel knob 530 of the dial switch apparatus 500 downward, the push signal may be input to the main PCB 800. The pushable positions of the wheel knob 530 are disposed at intervals of 90° in the circumferential direction of the wheel knob 530, and thus, the wheel knob 530 can be pushed by the user at four positions in the circumferential direction.

The lower portion of each of the touch type switch apparatus 400 and the dial switch apparatus 500 is inserted into the input unit insertion groove 130, and the upper portion of each apparatus protrudes to the outside of the input unit insertion groove 130. The upper portions of the touch type switch apparatus 400 and the dial switch apparatus 500 protrude to the outside of the input unit insertion groove 130 and are disposed above the main body 100, and the upper portions of the touch type switch apparatus 400 and the dial switch apparatus 500 disposed above the main body 100 are exposed through the hole 310 formed in the case body 300 covering the upper side of the main body 100. That is, the capacitive touch pad 410 and the wheel knob 530 are exposed to the outside of the case body 300 through the hole 310 formed in the case body 300, and the user may operate the exposed capacitive touch pad 410 and wheel knob 530.

The main PCB 800 is disposed below the input unit insertion groove 130 and the ring insertion groove 150 in the main body 100. The lower side of the main body 100 is open, and the main PCB 800 may be inserted into the main body 100 through the open lower side of the main body 100 and disposed below the input unit insertion groove 130 and the ring insertion groove 150. The switch signal from the switch signal input unit 500 may be input to the main PCB. At least one light source 805 is installed in a portion of the main PCB 800 corresponding to the ring insertion groove 150. The light source 805 may generate light and irradiate the ring insertion groove 150 with the light.

The mood ring 900 may be formed in an annular shape. The mood ring 900 may be formed in a cylindrical shape having open upper and lower sides. The lower end of the mood ring 900 is inserted into the ring insertion groove 150, and the upper end thereof protrudes to the outside of the ring insertion groove 150 and is disposed along the periphery of the dial switch apparatus 500.

The mood ring 900 includes a lower end portion 901, an intermediate portion 902 which extends upward from an upper end of the lower end portion 901, and an upper end portion 903 which extends upward from an upper end of the intermediate portion 902. The lower end portion 901 is inserted into the ring insertion groove 150, and the intermediate portion 902 and the upper end portion 903 are disposed to protrude to the outside of the ring insertion groove 150. The intermediate portion 902 has an outer diameter smaller than that of the lower end portion 901, and the upper end portion 903 has an outer diameter smaller than that of the intermediate portion 902.

The mood ring cover 950 is seated on a stair 904 between the lower end portion 901 and the intermediate portion 902 to surround the peripheries of the intermediate portion 902 and the second installation rib 120. The mood ring cover 950 includes a lower end portion 951 and an upper end portion 952 which extends upward from an upper end of the lower end portion 951. The upper end portion 952 has an outer diameter smaller than that of the lower end portion 951. The mood ring cover 950 is coupled to the main body 100. A coupling protrusion 955 which is coupled to the main body 100 is formed on the outer peripheral surface of the lower end 951. The coupling protrusion 955 may be fastened to the main body 100 through a screw to be coupled to the main body 100, and the mood ring cover 950 may be coupled to the main body 100 by the coupling protrusion 955 being coupled to the main body 100. The main body 100 may be seated on a stair 953 between the lower end 951 and the upper end 952.

The case body 300 is seated on a stair 905 between the middle portion 902 and the upper end portion 903 to surround the upper end portion 903.

The mood ring 900 may be illuminated by light generated by the light source 805.

However, a bottom surface 15 of the ring insertion groove 150 blocks a portion between the lower end of the mood ring 900 and the upper side of the light source 805. Accordingly, if the bottom surface 15 of the ring insertion groove 150 is formed of an opaque material, the mood ring 900 having the lower end inserted in the ring insertion groove 150 cannot be illuminated by the light generated by the light source 805. In order to allow the mood ring 900 having the lower end inserted in the ring insertion groove 150 to be illuminated with light, the bottom surface 15 of the ring insertion groove 150 includes the transparent portion 16 formed of a transparent material through which light generated by the mood ring 900 passes.

The transparent portion 16 may form the entire bottom surface 15 of the ring insertion groove 150, or may form a portion of the bottom surface 15 of the ring insertion groove 150. The transparent portion 16 blocks the portion between the lower portion of the mood ring 900 and the upper side of the light source 805, and thus, it is possible to prevent moisture from flowing through the mood ring 900 from the outside of the switch apparatus and flowing directly into the main PCB 800. In addition, the light generated by the light source 805 passes through the transparent portion 16 so that the mood ring 900 is illuminated with light.

The bottom surface 15 of the ring insertion groove 150 may further include a non-transparent portion 17 which is formed of an opaque material through which light generated by the light source 805 does not pass. Each of the transparent portion 16 and the non-transparent portion 17 may be formed in plural. The transparent portion 16 and the non-transparent portion 17 may be alternately formed along the circumferential direction of the ring insertion groove 150. In the present embodiment, eight transparent portions 16 and eight non-transparent portions 17 are formed.

The transparent portion 16 can be double-injection molded with the main body 100. The insert 70 formed of a transparent material may be inserted into the mold when the main body 100 is molded in the mold to form the transparent portion 16. The insert 70 may include an annular ring portion 71 and a transparent portion generating protrusion 72 protruding from a lower surface of the ring portion 71. The ring portion 71 may have a shape corresponding to the bottom surface 15 of the ring insertion groove 150. A plurality of transparent portion generating protrusions 72 may be formed, eight transparent portion generating protrusions 72 may be formed so that the number of transparent portion generating protrusions 72 is equal to the number of transparent portions 16. The transparent portion 16 may be a portion of the ring portion 71 in which the transparent portion generating protrusion 72 is formed. That is, in the mold, the ring portion 71 forms the entire bottom surface 15 of the ring insertion groove 150, portions between the plurality of transparent portion generating protrusions 72 on the lower surface of the ring portion 71 are filled with a molten resin forming the main body 100, the portion of the ring portion 71 where the transparent portion generating protrusion 72 is formed becomes the plurality of transparent portions 16, and the portion of the ring portion 71 corresponding to the portion filled with the molten resin becomes the plurality of non-transparent portions 17.

In FIG. 9, in order to distinguish the transparent portion 16 and the non-transparent portion 17, the non-transparent portion 17 is illustrated by black. However, in practice, the non-transparent portion 17 has the same color as that of the main body 100.

A groove 73 is formed on the lower surface of the transparent portion generating protrusion 72. The groove 73 is formed at a center of the transparent portion generating protrusion 72 in the circumferential direction. The groove 73 may be a groove where two inclined surfaces meet. A portion of the upper end of the mood ring 900 corresponding to the groove 73 may be illuminated with weaker light compared to the rest of the upper end. The groove 73 allows the portion corresponding to the switch signal generation position of the wheel knob 530 of the dial switch apparatus 500 to be illuminated with weak light so that the user can recognize a stopping position when operating when the user rotates the wheel knob 530 of the dial switch apparatus 500. In the present embodiment, the eight transparent portions 16 are provided, and thus, eight grooves 73 are also formed. Moreover, the wheel knob 530 of the dial switch apparatus 500 generates different switch signals every 45° rotation, and thus, generates a total of eight switch signals. The mood ring 900 is weakly illuminated at each of the eight switch signal generation positions, and thus, the user can see the position of the mood ring which is weakly generated when rotating the wheel knob 530 and recognize the position at which the wheel knob 530 stops.

As described above, in the switch apparatus for an automobile according to the embodiment of the present disclosure, the ring insertion groove 150 into which the lower end of the mood ring 900 is inserted is formed in the main body 100, and the transparent portion 16 is formed of a transparent material in which the light generated by the light source 805 passes through the bottom surface 15 of the ring insertion groove 150. Accordingly, the mood ring 900 can be illuminated with the light, and it is possible to prevent external moisture from flowing directly into the main PCB 800 through the mood ring 900.

Hereinafter, the touch type switch apparatus 400, the dial switch apparatus 500, and the scroll switch apparatus 600 will be described in detail.

First, the touch type switch apparatus 400 will be described with reference to FIGS. 10 to 14 as follows.

Figure 10:
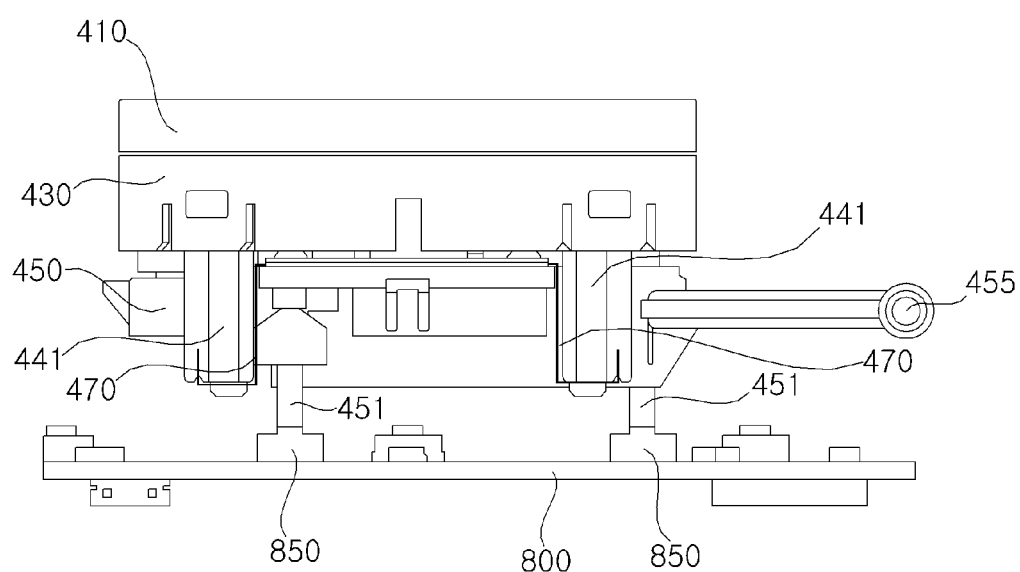
FIG. 10 is a side view illustrating the touch type switch apparatus illustrated in FIGS. 1 and 2.
Figure 11:
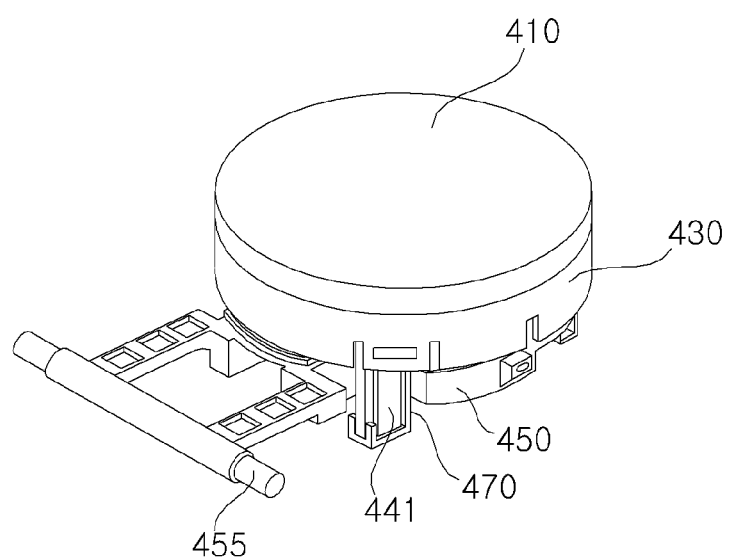
FIG. 11 is a combined perspective view in which the main PCB is excluded in FIG. 10.
Figure 12:
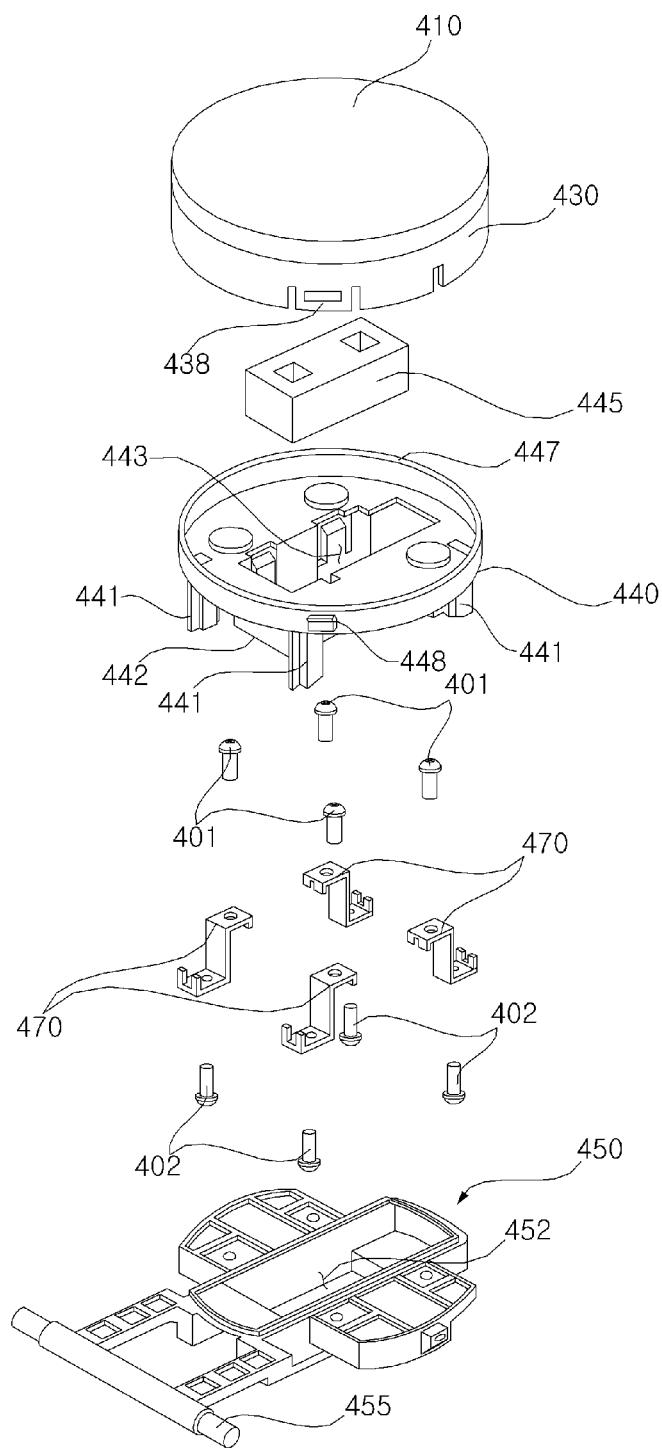
FIG. 12 is an exploded perspective view of FIG. 11.
Figure 13:
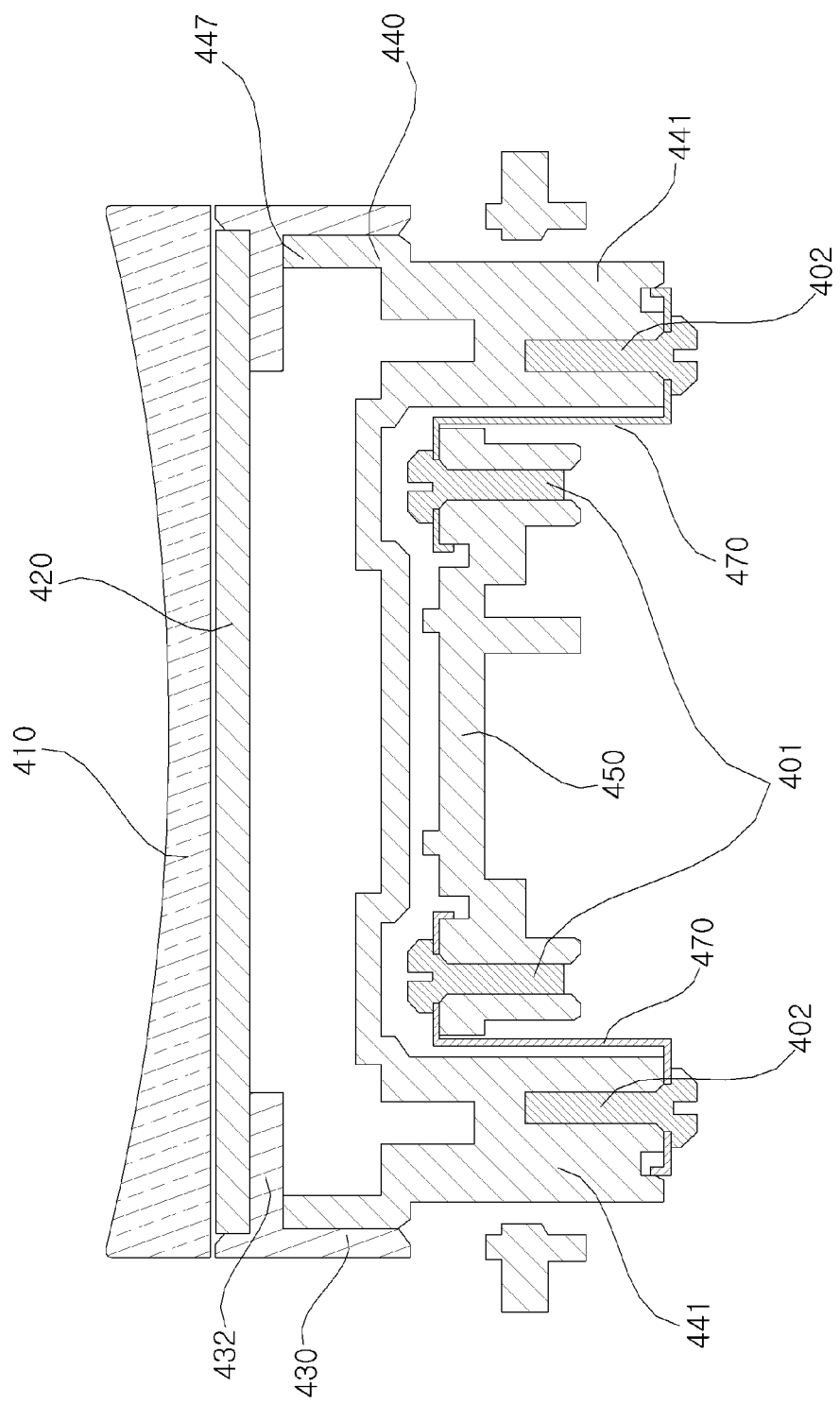
FIG. 13 is a side cross-sectional view of FIG. 11.
Figure 14:
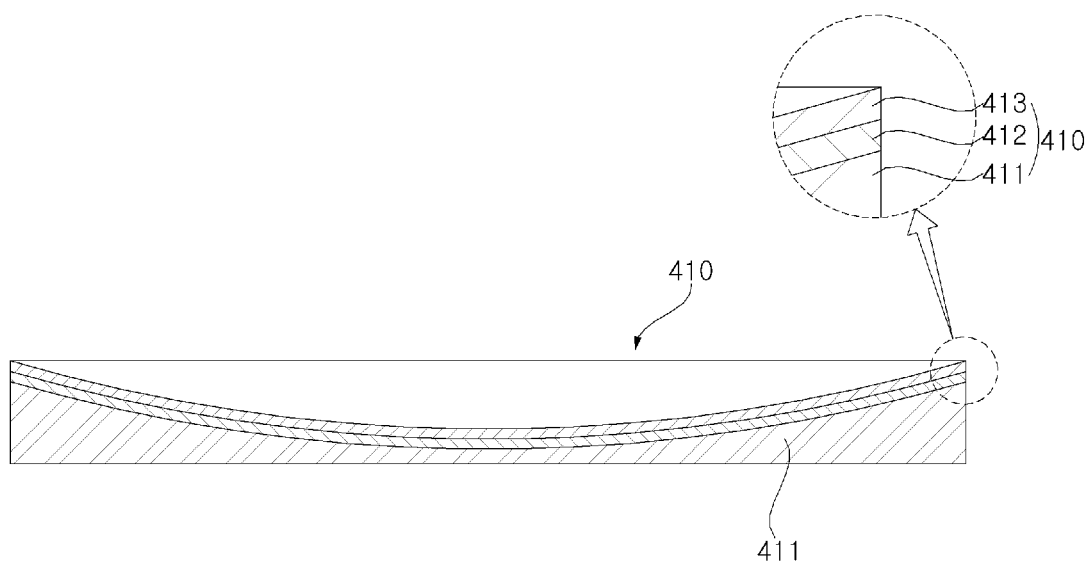
FIG. 14 is a side cross-sectional view illustrating a detailed configuration of the capacitive touch pad illustrated in FIG. 13.

FIG. 10 is a side view illustrating the touch type switch apparatus illustrated in FIGS. 1 and 2, FIG. 11 is a combined perspective view in which the main PCB is excluded in FIG. 10, FIG. 12 is an exploded perspective view of FIG. 11, FIG. 13 is a side cross-sectional view of FIG. 11, and FIG. 14 is a side cross-sectional view illustrating a detailed configuration of the capacitive touch pad illustrated in FIG. 13.

Referring to FIGS. 10 to 14, the touch type switch apparatus 400 includes the capacitive touch pad 410, the printed circuit board (PCB) 420, the case 430, the cover 440, the base 450, and the main PCB 800. The capacitive touch pad 410, the printed circuit board (PCB) 420, the case 430, the cover 440, the base 450, and the main PCB 800 are mounted on the upper side of main body 100 and are disposed in the case body 300. The upper surface of the capacitive touch pad 410 is exposed to the outside of the case body 300. In addition, the hinge shaft 455 to be described later may be rotatably coupled to the main body 100.

In the capacitive touch pad 410, the upper surface is touched by the user, and the plurality of cells sensing the touch of the user may be arranged in a grid form. The capacitive touch pad 410 may detect that the finger of the user passes through the plurality of cells arranged in the grid form, and thus detect a touch pattern of the finger of the user. The capacitive touch pad 410 may detect the touch direction and the touch shape of the finger of the user.

The capacitive touch pad 410 may have a circular cross-sectional shape.

The capacitive touch pad 410 may have the upper surface formed in a concave curved surface and the lower surface formed in a horizontal plane. In the capacitive touch pad 410, a vertical thickness of a center may be thinnest and gradually increase outward in the radial direction, and thus, the vertical thickness of an outer edge may be thickest.

In the related art, after glass is molded, the molded glass is sequentially subjected to polishing, reinforcing heat treatment, and anti-fingerprint coating, and thus, the capacitive touch pad is formed. However, in the present embodiment, after an acrylic resin is molded, the molded acrylic resin is sequentially subjected to anti-reflective coating, anti-fingerprint coating, and reinforcing heat treatment, and thus, the capacitive touch pad is formed. That is, referring to FIG. 14, the capacitive touch pad 410 of the present embodiment includes a plastic portion 411 formed of an acrylic (PMMA) resin, an anti-glare portion 412 coated on an upper surface of the plastic portion 411, and an anti-fingerprint portion 413 coated on an upper surface of the anti-glare portion 412.

The plastic portion 411 may be formed by injection molding the acrylic resin in a mold. Accordingly, the capacitive touch pad of the related art, after the glass is molded, the molded glass is subjected to cumbersome polishing. However, in the capacitive touch pad 410 of the present embodiment, it is not necessary to perform the polishing of the related art. In addition, after the anti-glare portion 412 is coated on the upper surface of the molded plastic portion 411 and the anti-fingerprint portion 413 is coated on the upper surface of the anti-glare portion 412, the reinforcement heat treatment is performed. Accordingly, hardness equivalent to that of the glass of the related art can be secured.

The upper surface of the PCB 420 may be adhered to the lower surface of the capacitive touch pad 410. The upper surface of the PCB 420 is adhered to the lower surface of the capacitive touch pad 410 through an adhesive, and thus, a touch-type switch having a simple structure can be configured. A touch signal generated by the user touching the capacitive touch pad 410 may be input to the PCB 420. After the lower surface of the capacitive touch pad 410 is shielded and painted to prevent light leakage, the upper surface of the PCB 420 may be vacuum-adhered to the lower surface of the capacitive touch pad 410 through the adhesive. It is preferable that the vacuum adhesion is performed so that bubbles do not exist on the lower surface of the capacitive touch pad 410 and the upper surface of the PCB 420.

The PCB 420 may have a circular cross-sectional shape.

The PCB 420 may be inserted into the case 430 and coupled to the case 430. The PCB 420 has a diameter slightly larger than an inner diameter of the case 430, and thus, may be pressure-fitted into the case 430 and coupled thereto.

The case 430 may be formed in an annular shape. The case 430 may have upper and lower sides respectively open. The open upper side is covered with the capacitive touch pad 410 so that the case 430 is shielded. The open lower side is covered with the cover 440 so that case 430 is shielded. The PCB 420 may be inserted into the case 430.

The capacitive touch pad 410 and the case 430 may have the same outer diameter as each other. The capacitive touch pad 410 may be seated on the upper end of the case 430.

A first stair portion 432 may be formed inside the case 430.

The first stair portion 432 may be formed to protrude in the radial direction. The first stair portion 432 is formed to protrude from an inner circumferential surface of the case 430 in the radial direction, and may be continuously formed in the circumferential direction. The first stair portion 432 may be formed in an annular shape. The first stair portion 432 may have a horizontal upper surface. The PCB 420 may be mounted on the upper surface of the first stair portion 432.

The cover 440 may be inserted into the open lower side of the case 430 to cover the open lower side of the case 430. The cover 440 may be coupled to the case 430.

The cover 440 may have an edge rib 447 protruding upward along an upper edge. The rim rib 447 may be continuously formed in the circumferential direction. When the cover 440 is inserted into the open lower side of the case 430, the edge rib 447 may come into contact with the lower surface of the first stair portion 432.

A hook hole 438 may be formed on the peripheral surface of the case 430. A hook protrusion 448 inserted into and coupled to the hook hole 438 may be formed on the peripheral surface of the cover 440. When the cover 440 is inserted into the open lower side of the case 430, the hook protrusion 448 is inserted into the hook hole 438, and thus, the case 430 and the cover 440 may be coupled to each other.

The actuator 445 may be installed inside the case 430. The actuator 445 may include a motor and a vibration generating unit which generates vibrations by an operation of the motor. The actuator 445 may be vibrated in the horizontal direction when the motor is operated.

The base 450 may be disposed below the cover and coupled to the cover 440. The base 450 may include the hinge shaft 455 disposed in the horizontal direction. The hinge shaft 455 may be disposed radially outside the capacitive touch pad 410 and the case 430. The base 450 may rotate up and down with the hinge shaft 455 as a rotation center. Accordingly, when the user presses the upper surface of the capacitive touch pad 410 downward, the base 450 may be rotated downward with the hinge shaft 455 as a rotation center. In addition, when the actuator 445 is operated and vibrated in the horizontal direction, the base 450 can give a feedback with respect to the pressing of the capacitive touch pad 410 to the user while being rotated up and down with the hinge shaft 455 as the rotation center by the vibrations. A pusher portion 451 may protrude from the lower surface of the base 450.

The main PCB 800 may be disposed below the base. A switch 850 may be provided on the upper surface of the main PCB 800. The switch 850 may be contacted by the pusher portion 451 when the base 450 is rotated downward with the hinge shaft 455 as a rotation center. The switch 850 may include a force switch and may be switched on when the pusher unit 451 is pressed. The switch 850 may be contacted by the pusher portion 451 to operate the actuator 445.

The cover 440 and the base 450 may be spaced apart from each other. The cover 440 and the base 450 spaced apart from each other may be coupled to each other through an elastic member 470. When the base 450 is vibrated in the horizontal direction by the operation of the actuator 445, the elastic member 470 provides an elastic force to the base 450 in the horizontal direction so that the base 450 moves to an original position thereof. A plurality of elastic members 470 may be provided, and in the present embodiment, four elastic members 470 may be provided. The four elastic members 470 are disposed at intervals of 90° on a plane.

A mounting protrusion 441 may protrude from the lower surface of the cover 440. The mounting protrusion 441 may extend to a side surface of the base 450. A plurality of mounting protrusions 441 may be provided, and in the present embodiment, four mounting protrusions 441 are provided, and the number of the mounting protrusions 441 corresponds to the number of elastic members 470. The four mounting protrusions 441 are disposed at intervals of 90° on a horizontal plane.

The elastic member 470 may be formed of a plate spring in which an upper end and a lower end thereof are bent, and thus, the upper end is coupled to the upper surface of the base 450 and the lower end may be coupled to the lower surface of the mounting protrusion 441. The upper end of the elastic member 470 may be coupled to the upper surface of the base 450 through a first screw 401, and the lower end of the elastic member 470 may be coupled to the lower surface of the mounting protrusion 441 through the second screw 402. It is preferable that a fastening hole to which the first screw 401 is fastened is formed on the upper surface of the base 450, and a fastening hole to which the second screw 402 is fastened is formed on the lower surface of the mounting protrusion 441. The elastic member 470 is formed vertically, and thus, when the base 450 is vibrated in the horizontal direction by the horizontal vibrations of the actuator 445, an elastic force in the horizontal direction may be generated.

An accommodation protrusion 442 may protrude from the lower surface of the cover 440. The accommodation protrusion 442 may have a rectangular hollow structure, and thus, an accommodation hole 443 may be formed therein. The actuator 445 may be accommodated in the accommodation hole 443. An insertion hole 452 into which the accommodation protrusion 442 formed in the cover 440 is inserted may be formed in the base 450.

As described above, in the touch type switch apparatus 400, the base 450 has the hinge shaft 455 which is disposed in the horizontal direction and is configured to be rotated with the hinge shaft 455 as the rotation center, and the actuator 445 is configured to be vibrated in the horizontal direction. Therefore, when the user presses the upper surface of the capacitive touch pad 410 downward, the base 450 is rotated downward with the hinge shaft 455 as the rotation center, and accordingly, the pusher portion 451 protruding from the lower surface of the base 450 contacts the switch 850, and thus, the actuator 445 is operated and vibrated in the horizontal direction. In this case, the base 450 is rotated up and down with the hinge shaft 455 as the rotation center by the vibrations, and thus, the user can feel the feedback pressing the upper surface of the capacitive touch pad 410 downward.

Meanwhile, the horizontal direction described above may mean a direction orthogonal to a pressing direction of the capacitive touch pad 410, and the up-down direction may mean a direction parallel to the pressing direction of the capacitive touch pad 410.

Figure 15:
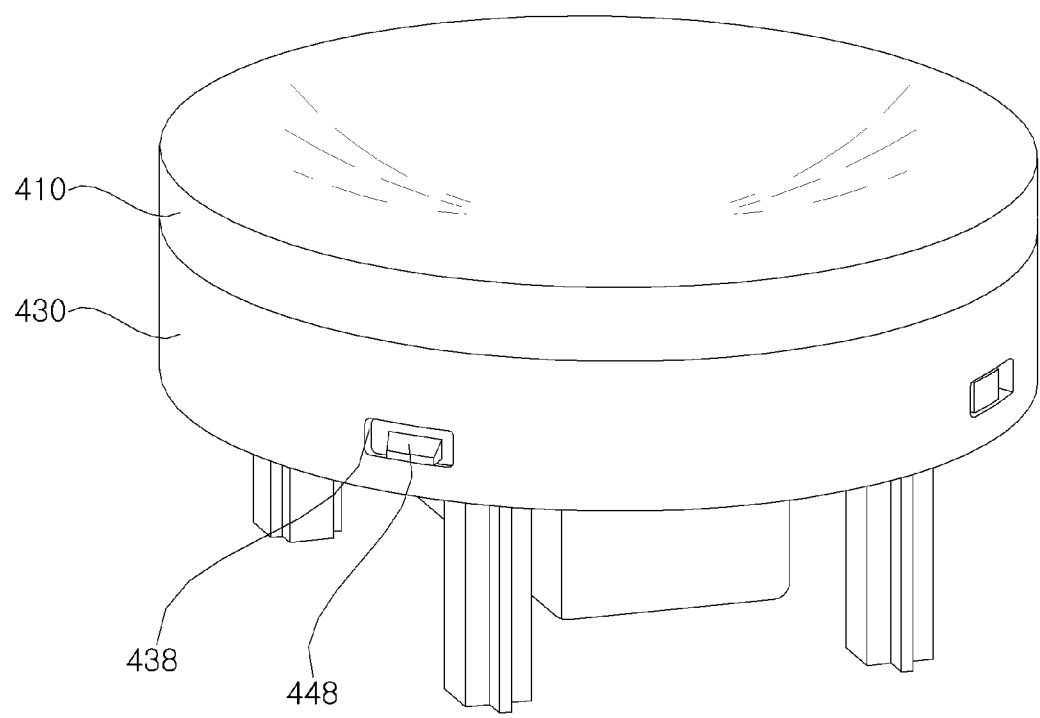
FIG. 15 is a view illustrating an upper configuration of the touch type switch apparatus illustrated in FIGS. 10 and 11.
Figure 16:
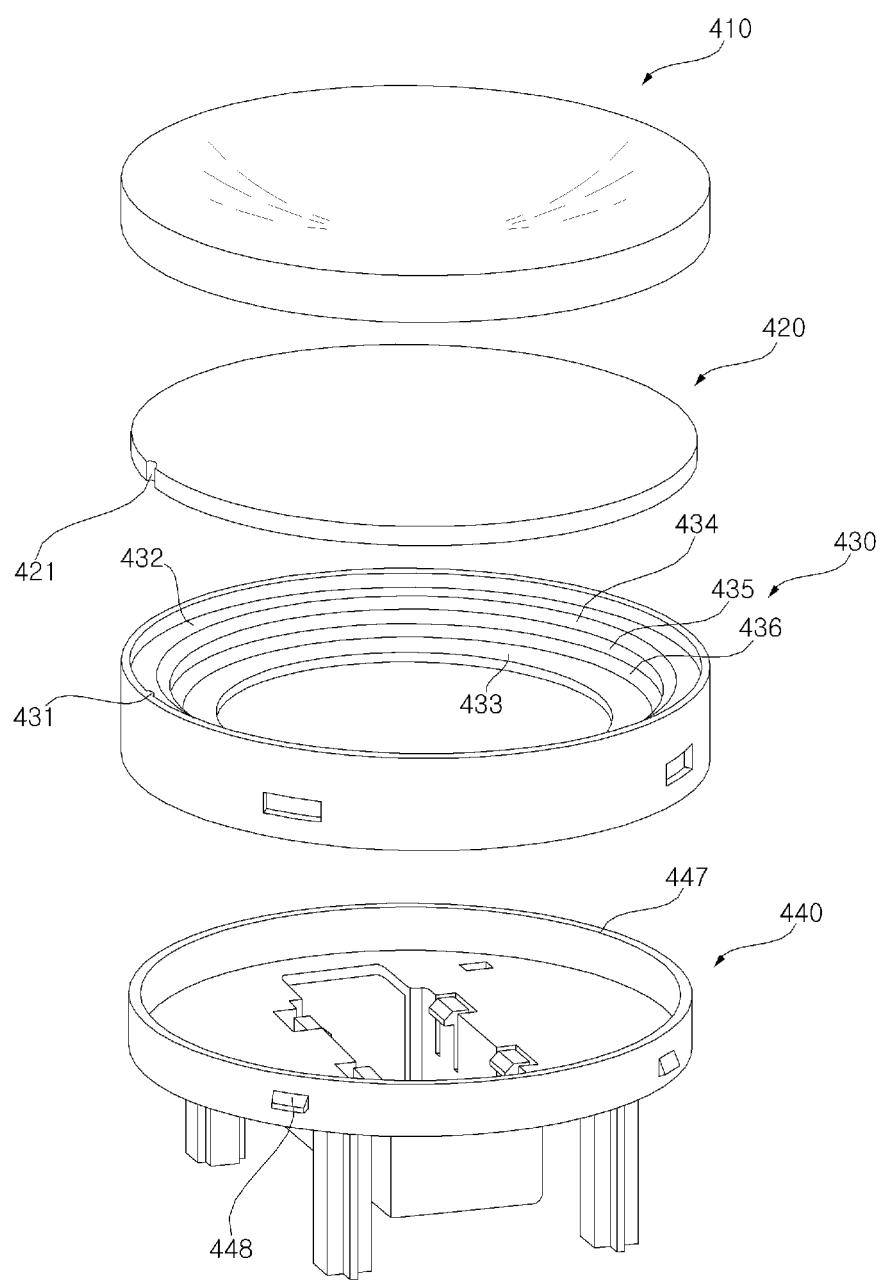
FIG. 16 is an exploded perspective view of FIG. 15.
Figure 17:
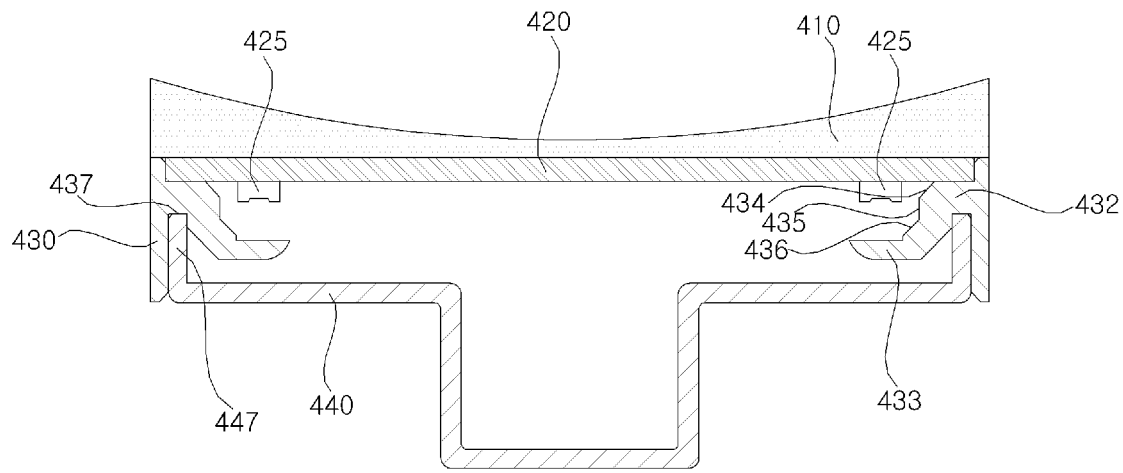
FIG. 17 is a side cross-sectional view of FIG. 15.

FIG. 15 is a view illustrating an upper configuration of the touch type switch apparatus illustrated in FIGS. 10 and 11, FIG. 16 is an exploded perspective view of FIG. 15, and FIG. 17 is a side cross-sectional view of FIG. 15.

Referring to FIGS. 15 to 17, a light source 425 may be installed on the lower surface of the PCB 420. A plurality of light sources 425 may be provided on the lower surface of the PCB 420 to be spaced apart from each other along the circumferential direction. The light source 425 may generate light. The light source 425 may include a light emitting diode (LED). The light source 425 may have a light emitting surface disposed downward. The light source 425 may emit the generated light downward.

A coupling groove 421 may be formed on an outer peripheral surface of the PCB 420, and a coupling protrusion 431 inserted into the coupling groove 421 may be formed on an inner peripheral surface of the case 430.

The case 430 may be illuminated by light generated by the light source 425 disposed on the PCB 420.

The first stair portion 432 and a second stair portion 433 may be formed inside the case 430.

Each of the first stair portion 432 and the second stair portion 433 may be formed to protrude in a radial direction. Each of the first stair portion 432 and the second stair portion 433 may be continuously formed in the circumferential direction while being formed to protrude from the inner circumferential surface of the case 430 in the radial direction. Each of the first stair portion 432 and the second stair portion 433 may be formed in an annular shape. Each of the first stair portion 432 and the second stair portion 433 may have an upper surface formed in a horizontal plane. The PCB 420 may be seated on the upper surface of the first stair portion 432. The second stair portion 433 may protrude from a lower portion of the first stair portion 432 in the radial direction to extend downward of the light source 425. The second stair portion 433 may protrude radially from the inner peripheral surface of the first stair portion 432. The light source 425 generates light and emits the light downward, and the second stair portion 433 may guide the light to the first stair portion 432 and the outside of the case 430 to illuminate the case 430 while being illuminated by the light emitted by the light source 425.

A surface connecting the upper surface of the first stair portion 432 and the upper surface of the second stair portion 433 to each other may include a first inclined surface 434, a vertical surface 435, and a second inclined surface 436. The first inclined surface 434 may extend upward from an upper end of the vertical surface 435, and the second inclined surface 436 may extend downward from a lower end of the vertical surface 435. The vertical surface 435 may connect between the first inclined surface 434 and the second inclined surface 436. Each of the first inclined surface 434 and the second inclined surface 436 may be disposed closer to the center of the case 430 downward. Each of the first inclined surface 434, the vertical surface 435, and the second inclined surface 436 may be formed continuously in the circumferential direction of the case 430.

An insertion groove 437 into which the edge rib 447 is inserted may be formed on the lower surface of the first stair portion 432. When the cover 440 is inserted into the open lower side of the case 430, the edge rib 447 may be inserted into the insertion groove 437.

As described above, in the switch apparatus for an automobile according to the embodiment of the present disclosure, the case 430 is illuminated. Accordingly, the user can recognize the position of the capacitive touch pad 410 through subtle light emitted from the case 430 and emotions of the user can be improved.

Secondly, the dial switch apparatus 500 will be described with reference to FIGS. 18 to 23 as follows.

Figure 18:
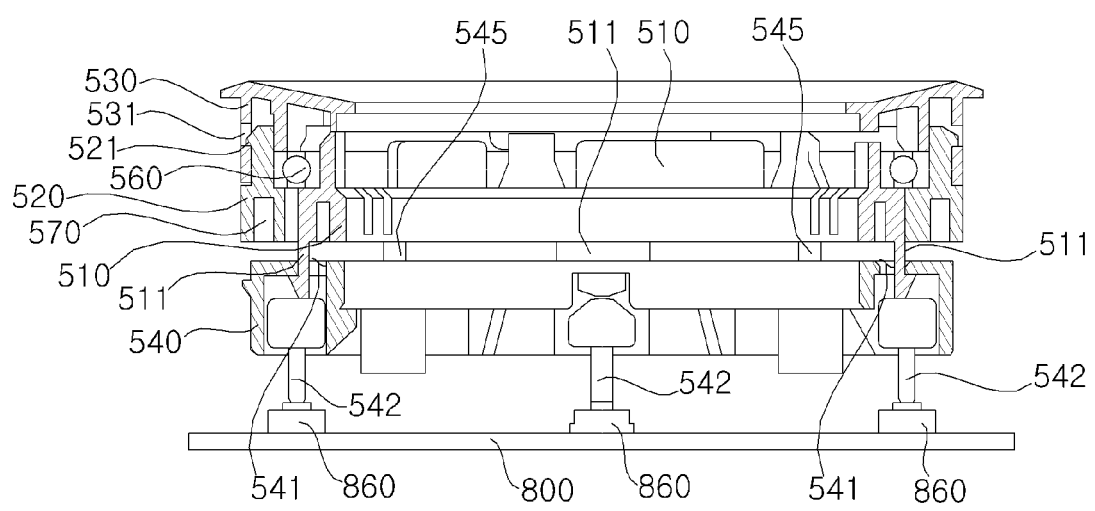
FIG. 18 is a side cross-sectional view illustrating the dial switch apparatus illustrated in FIGS. 1 and 2.
Figure 19:
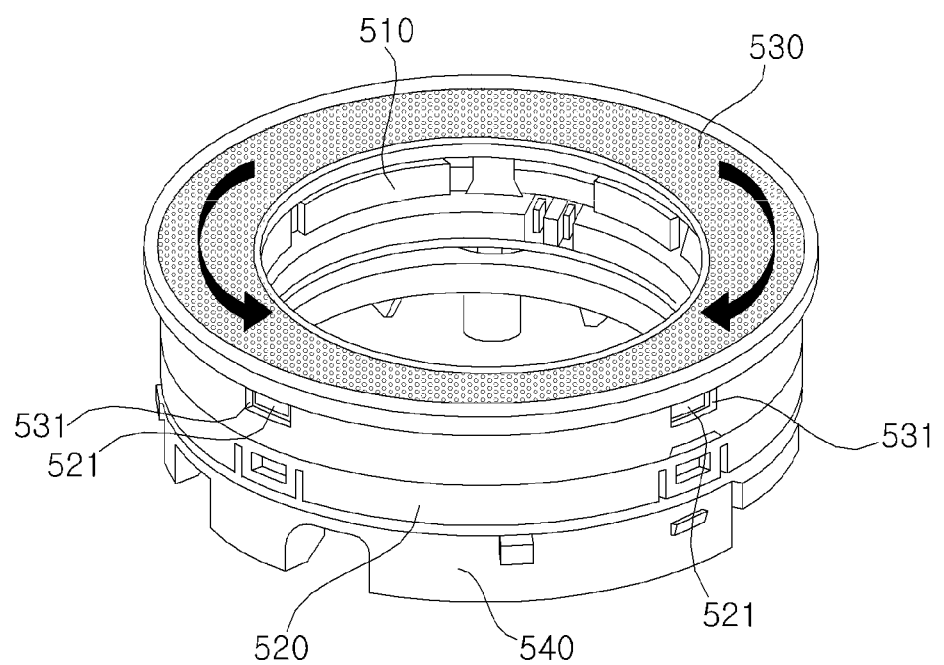
FIG. 19 is a combined perspective view in which the main PCB is excluded in FIG. 18.
Figure 20:
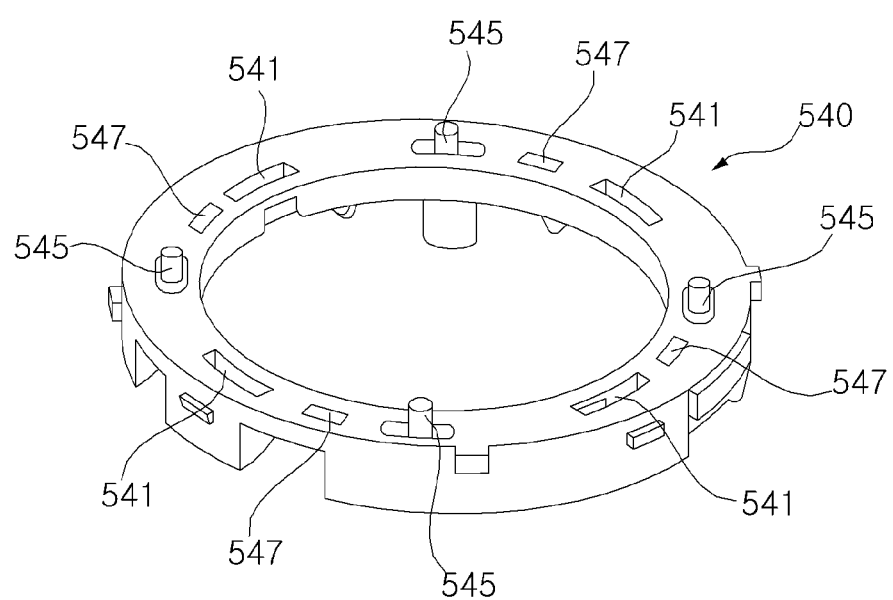
FIG. 20 is a perspective view illustrating a wheel base illustrated in FIG. 19.
Figure 21:
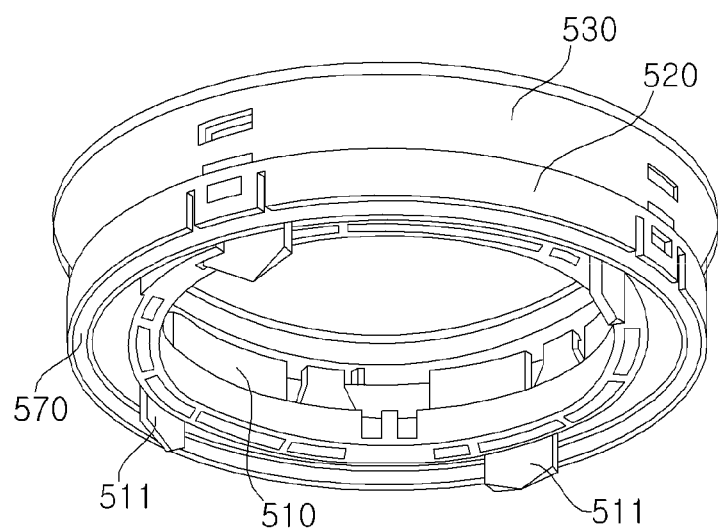
FIG. 21 is a bottom perspective view in which the wheel base is excluded in FIG. 19.
Figure 22:
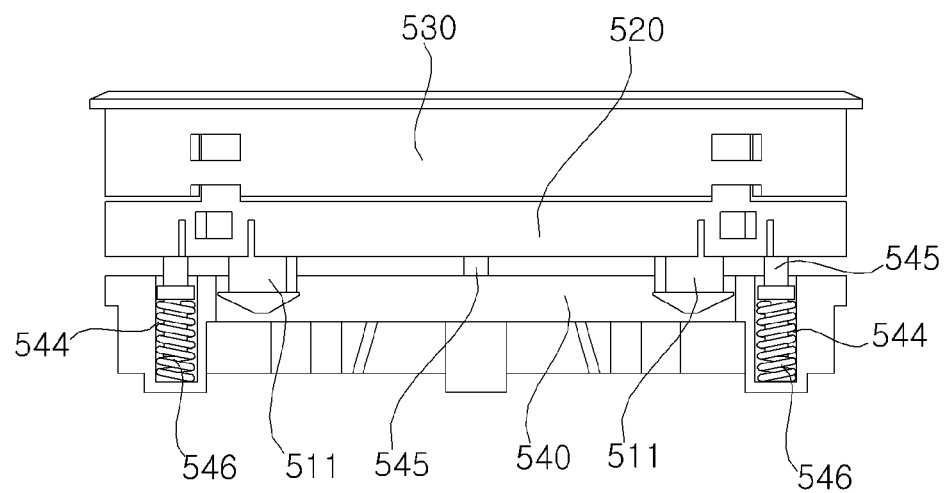
FIG. 22 is a side view of FIG. 19 and a view illustrating a side cross-sectional view of the wheel base.
Figure 23:
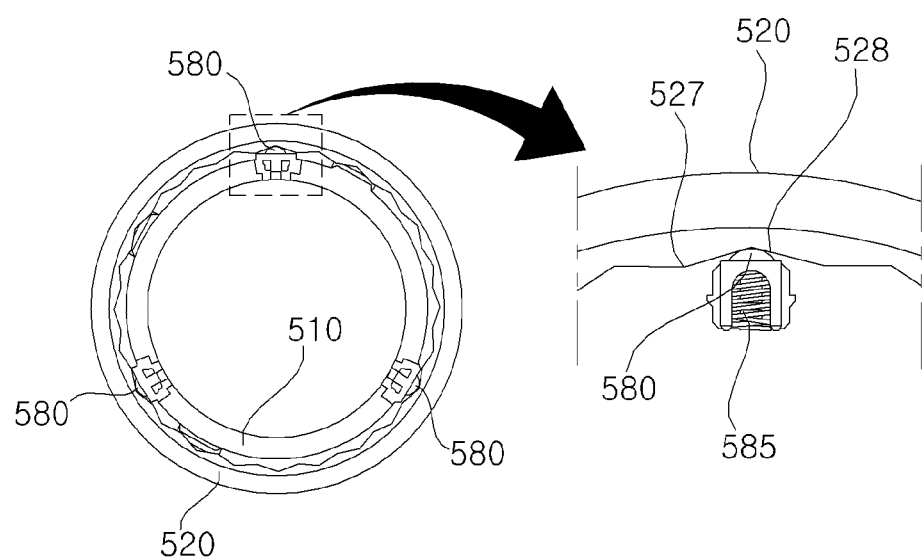
FIG. 23 is a plan view illustrating an inner wheel and an outer wheel illustrated in FIG. 19.

FIG. 18 is a side cross-sectional view illustrating the dial switch apparatus illustrated in FIGS. 1 and 2, FIG. 19 is a combined perspective view in which the main PCB is excluded in FIG. 18, FIG. 20 is a perspective view illustrating a wheel base illustrated in FIG. 19, FIG. 21 is a bottom perspective view in which the wheel base is excluded in FIG. 19, FIG. 22 is a side view of FIG. 19 and a view illustrating a side cross-sectional view of the wheel base, and FIG. 23 is a plan view illustrating an inner wheel and an outer wheel illustrated in FIG. 19.

Referring to FIGS. 18 to 23, most of the dial switch apparatus 500 is formed in an annular shape. The dial switch apparatus 500 includes the inner wheel 510, the outer wheel 520, the wheel knob 530, the wheel base 540, and the main PCB (printed circuit board) 800. The inner wheel 510, the outer wheel 520, the wheel knob 530, and the wheel base 540 are mounted above the main body 100 and disposed in the case body 300, and the upper side of the wheel knob 530 may be disposed to be exposed to the upper side of the case body 300. The user can rotate the wheel knob 530 in the circumferential direction by placing a hand on the upper side of the wheel knob 530 exposed to the upper side of the case body 300.

A surface of the wheel knob 530 may be formed of the same metal material as that of the surface of the case body 300. That is, the surface of the wheel knob 530 is plated with chrome, and thus, the wheel knob 530 may have an approximately silvery color.

Each of the inner wheel 510, the outer wheel 520, the wheel knob 530, and the wheel base 540 may be formed in an annular shape to form a space therein, and the touch type switch apparatus 400 is installed in the inner space.

The inner wheel 510 and the outer wheel 520 may be spaced apart from each other in the radial direction. That is, an outer peripheral surface of the inner wheel 510 and an inner peripheral surface of the outer wheel 520 are spaced apart from each other, and thus, an empty space may be formed between the outer peripheral surface of the inner wheel 510 and the inner peripheral surface of the outer wheel 520. The inner wheel 510 may be disposed in the inner space of the outer wheel 520.

The outer wheel 520 may be rotatably coupled to the inner wheel 510 in the circumferential direction. In the present embodiment, the outer wheel 520 is rotatably coupled to the inner wheel 510 through the bearing 560 in the circumferential direction. The bearing 560 is disposed between the outer peripheral surface of the inner wheel 510 and the inner circumferential surface of the outer wheel 520 so as to rotatably couple the outer wheel 520 to the inner wheel 510. That is, the inner ring of the bearing 560 is coupled to the outer peripheral surface of the inner wheel 510, the outer ring of the bearing 560 is coupled to the inner peripheral surface of the outer wheel 520, and thus, the outer wheel 520 can be rotatably coupled to the inner wheel 510.

The wheel knob 530 is a portion that the user directly rotates in a circumferential direction with a finger, and a plurality of protrusions may be formed on the upper surface of the wheel knob 530. The plurality of protrusions may prevent the finger from sliding on the wheel knob 530 when the user rotates the wheel knob 530 in the circumferential direction.

The wheel knob 530 may cover the upper sides of the inner wheel 510 and the outer wheel 520 and may be coupled to the outer wheel 520. An upper end portion of the outer wheel 520 may be inserted into the lower surface of the wheel knob 530. An annular groove into which the upper end portion of the outer wheel 520 is inserted may be formed on the lower surface of the wheel knob 530. A coupling protrusion 521 may be formed on a peripheral surface of the outer wheel 520, and a coupling hole 531 into which the coupling protrusion 521 is inserted may be formed on a peripheral surface of the wheel knob 530. When the upper end portion of the outer wheel 520 is inserted into the lower surface of the wheel knob 530, the coupling protrusion 521 is inserted into the coupling hole 531, and thus, the outer wheel 520 and the wheel knob 530 can be coupled to each other. A plurality of coupling protrusions 521 may be formed on the outer peripheral surface of the upper end portion of the outer wheel 520 along the circumferential direction, and a plurality of coupling holes 531 may be formed on the outer peripheral surface of the wheel knob 530 along the circumferential direction so as to correspond to the number of coupling protrusions 521.

The lower end portion of the outer wheel 520 may not be inserted into the lower surface of the wheel knob 530 and may be disposed to protrude toward the lower side of the wheel knob 530. The magnet 570 may be inserted into and disposed below the lower end portion of the outer wheel 520. It is preferable that an insertion groove into which the magnet 570 is inserted is formed on the lower end portion of the outer wheel 520.

A Hall sensor 547 which detects the rotation angles of the wheel knob 530 and the outer wheel 520 in response to the magnet 570 may be disposed on the upper surface of the wheel base 540. The Hall sensor 547 may detect the rotation angles of the wheel knob 530 and the outer wheel 520 and transmit the rotation angles to the main PCB 800, and the main PCB 800 may generate different switch signals according to the rotation angles of the wheel knob 530 and the outer wheel 520 input from the Hall sensor 547 and input the switch signals to a controller. A plurality of Hall sensors 547 may be provided to be spaced apart from each other along the circumferential direction of the wheel base 540.

The wheel base 540 may be disposed below the inner wheel 510 and the outer wheel 520. The inner wheel 510 may be coupled to the wheel base 540 so as to be movable up and down. A hook hole 541 communicating vertically is formed on the upper surface of the wheel base 540, and a hook portion 511 inserted into the hook hole 541 may be formed to protrude downward from the inner wheel 510. The hook portion 511 is installed to be movable up and down in the hook hole 541 and couples the inner wheel 510 to the wheel base 540 so as to be movable up and down.

A pusher portion 542 may be formed to protrude from the lower surface of the wheel base 540.

When the wheel knob 530 is pressed downward by the user, the inner wheel 510 move downward while being rotated in the up-down direction with the hook portion 511 as a rotation center, a lower surface of a portion where the hook portion 511 is formed may come into contact with the upper surface of the wheel base 540, and after the lower surface of the inner wheel 510 comes into contact with the upper surface of the wheel base 540, the wheel base 540 may move downward together with the inner wheel 510. When the wheel base 540 is moved downward, the pusher portion 542 may contact a switch 860 to be described later.

When the wheel knob 530 is pressed downward by the user, in the inner wheel 510, the lower surface of the portion where the hook portion 511 is formed may come into contact with the upper surface of the wheel base 540, and thus, the hook hole 541 and the pusher portion 542 are formed at corresponding positions vertically, and, the pusher portion 542 can contact the switch 860 by a downward pressing force of the user.

Four hook holes 541 are disposed on the upper surface of the wheel base 540 at intervals of 90° along the circumferential direction, and four hook portions 511 may be provided to be inserted into the four hook holes 541, respectively. Accordingly, the dial switch apparatus 500 enables the user to perform the push operation at four points corresponding to the four hook portions 511 on the upper surface of the wheel knob 530, respectively.

The main PCB 800 is disposed below the wheel base. The switch 860 is provided on the upper surface of the main PCB 800. The switch 860 is contacted by the pusher portion 542 when the wheel knob 530 is pressed downward by the user, and the main PCB 800 may generate a switch signal when the switch 860 is contacted and input the switch signal to the controller unit.

An accommodation groove 544 may be formed on the upper surface of the wheel base 540. An elastic member 546 and a support member 545 may be accommodated in the accommodation groove 544. The elastic member 546 may be disposed below the support member 545 to elastically support the support member 545. The support member 545 may be elastically supported by the elastic member 546 and may be disposed so as to be movable up and down in the accommodation groove 544. An upper end of the support member 545 protrudes upward from the wheel base 540 through the accommodation groove 544 to come into contact with the lower surface 510, and thus, the support member 545 can support the inner wheel 510. A lower end portion of the support member 545 protrudes in the radial direction and is engaged in the accommodation groove 544, and thus, the support member 545 may not escape to the upper side of the wheel base 540 through the accommodation groove 544.

The support member 545 moves downward together with the inner wheel 510 which is moved downward when the upper surface of the wheel knob 530 is pressed downward by the user, and accordingly, the elastic member 546 may be compressed to generate an elastic force which pushes the support member 545 upward. Therefore, when the pressing force of the user pressing the upper surface of the wheel knob 530 is released, the inner wheel 510 can be moved to the upper side which is the original position by the elastic force of the elastic member 546 and the support member 545.

A plurality of support member 545 and a plurality of elastic members 546 are provided in the wheel base 540. In the present embodiment, four support members 545 and four elastic members 546 are provided. The support member 545 is disposed between two hook holes 541. The hook hole 541 is disposed between two support members 545.

Meanwhile, protrusions 527 and grooves 528 may be alternately formed on the inner circumferential surface of the outer wheel 520 along the circumferential direction, and detents 580 and detent elastic member 585 elastically supporting the detents 580 may be provided in the inner wheel 510. The detent 580 may be disposed in contact with at least one of the protrusion 527 and the groove 528 by an elastic force of the detent elastic member 585. Accordingly, the detent 580 may generate vibrations generated while riding the protrusion 527 and the groove 528 when the outer wheel 520 rotates in the circumferential direction. The user can feel an operating feeling of rotating the wheel knob 530 by the vibrations.

As described above, the entire shape of the dial switch apparatus 500 is formed in an annular shape, and thus, the touch type switch apparatus 400 can be installed in the inner space of the dial switch apparatus 500.

Thirdly, the scroll switch apparatus 600 will be described with reference to FIGS. 24 to 27 as follows.

Figure 24:
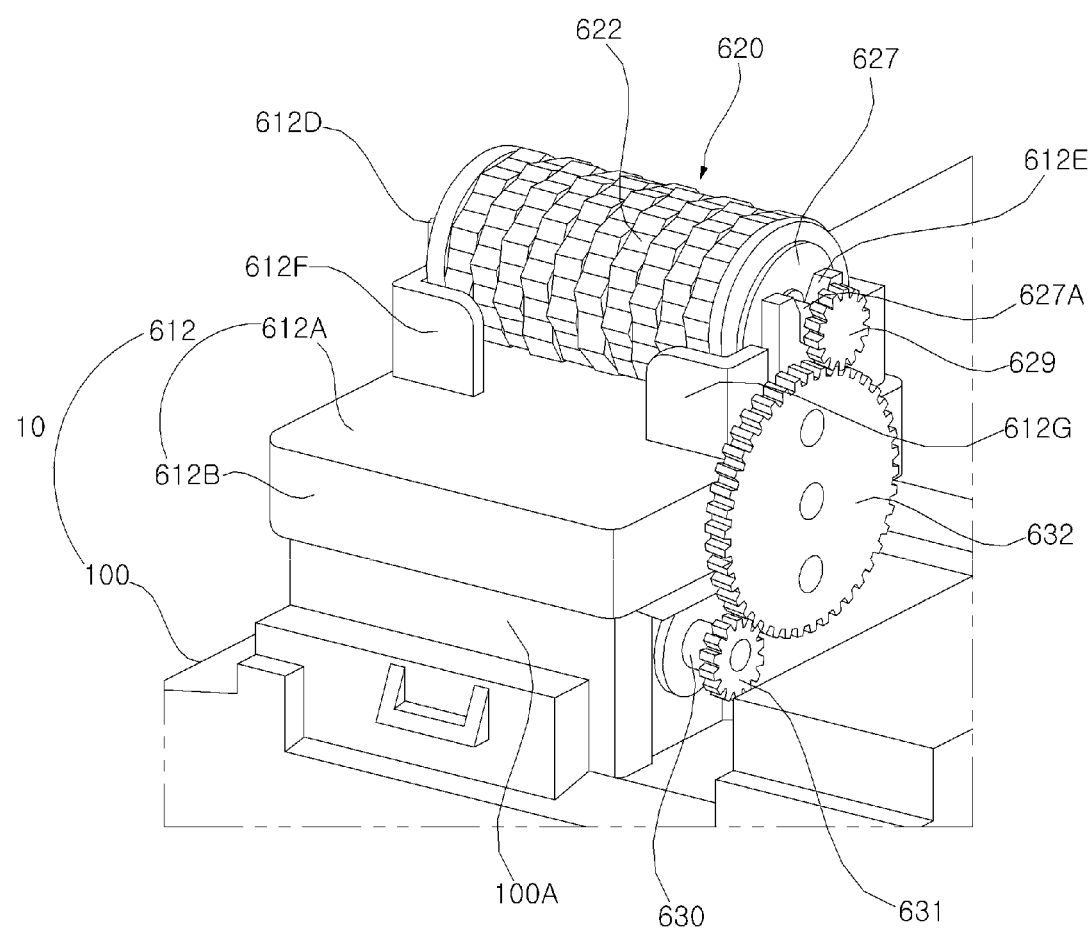
FIG. 24 is a perspective view illustrating a scroll switch apparatus illustrated in FIGS. 1 and 2.
Figure 25:
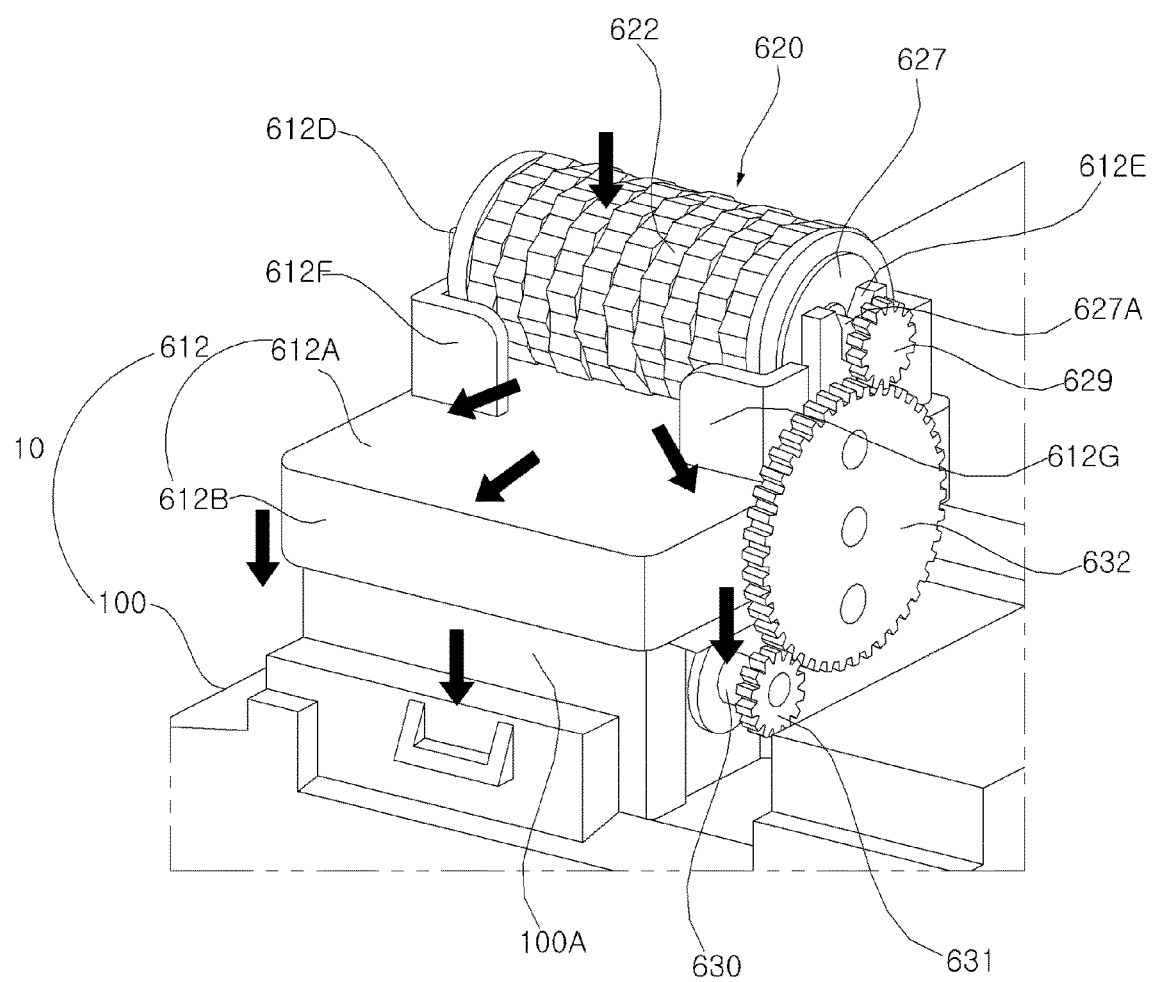
FIG. 25 is a diagram illustrating a path through which moisture flows in FIG. 24.
Figure 26:
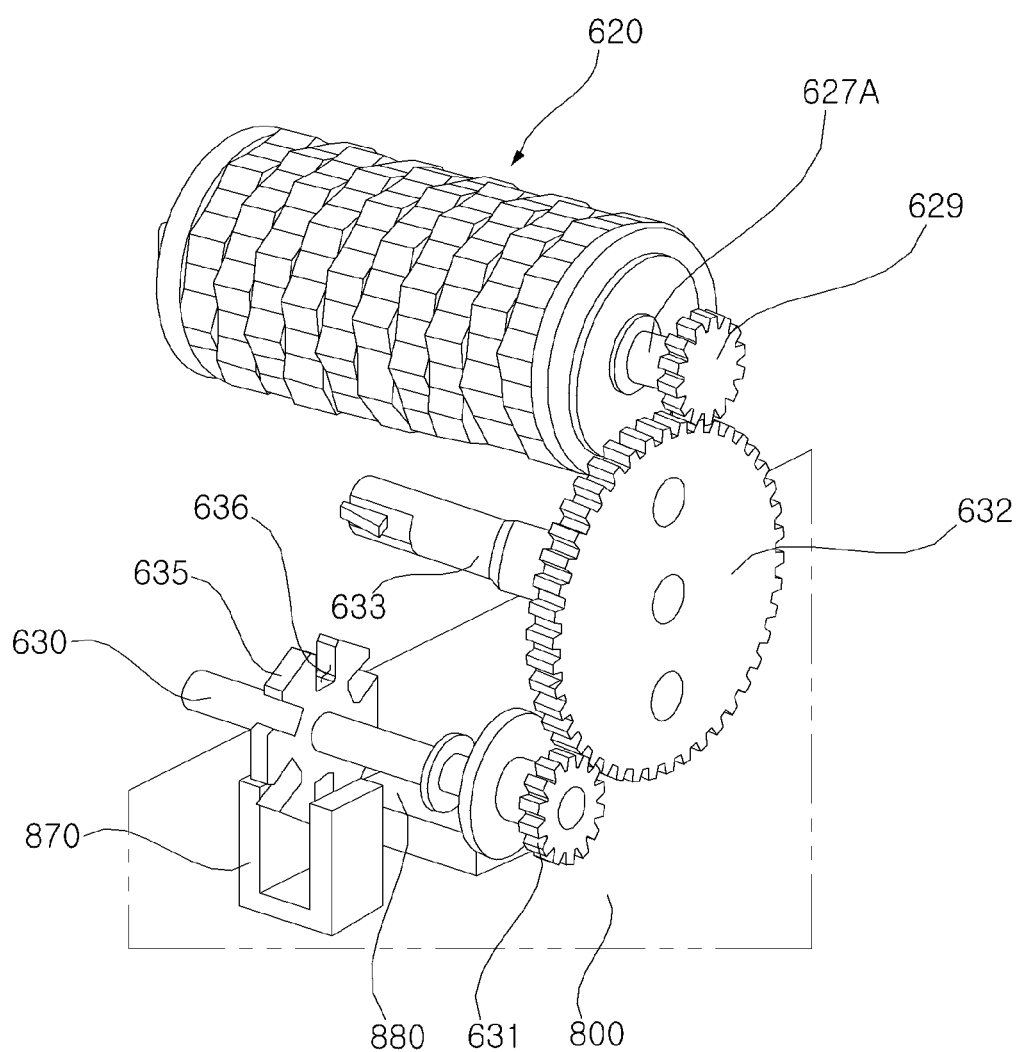
FIG. 26 is a view in which the main body and a knob holder are removed in FIG. 24.
Figure 27:
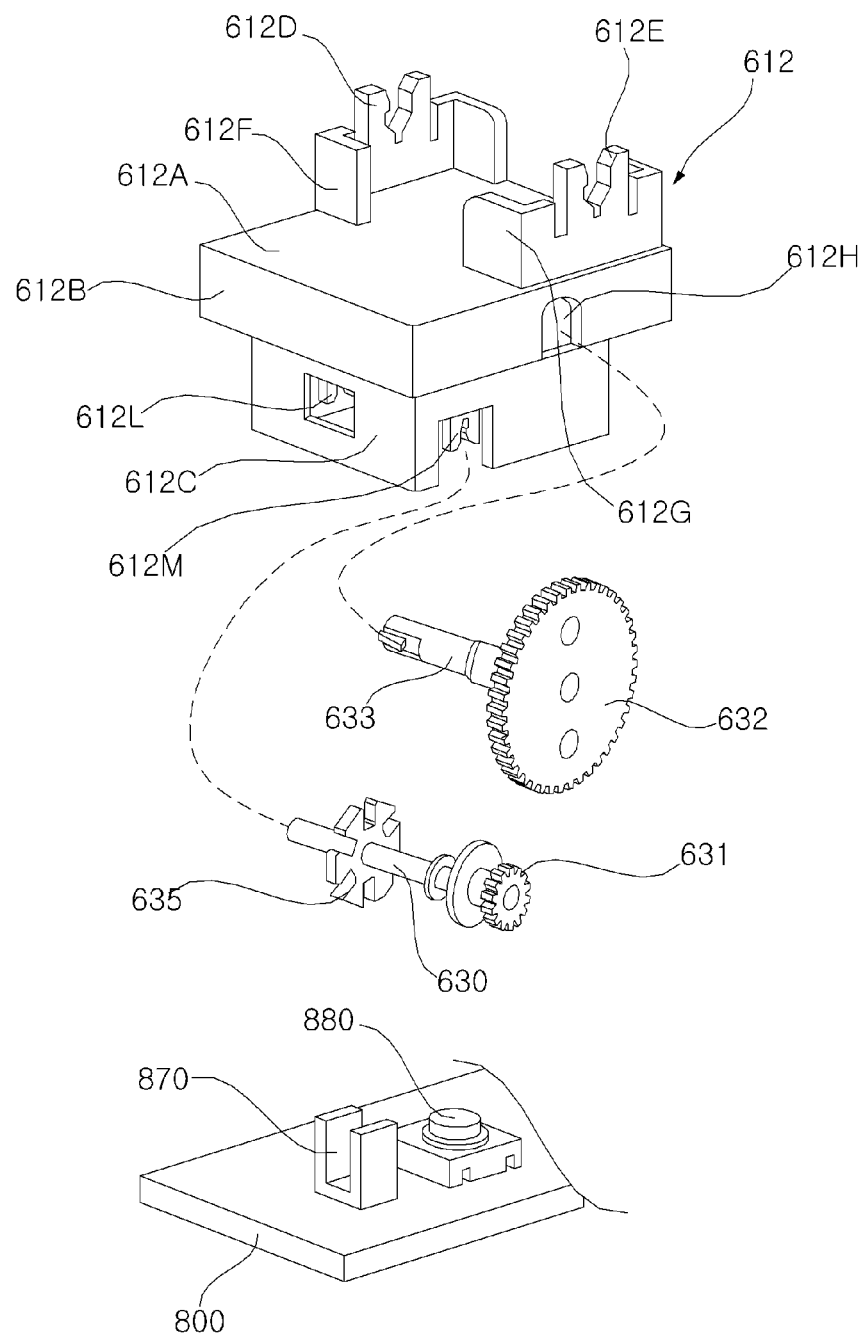
FIG. 27 is a perspective view illustrating a portion of a configuration illustrated in FIG. 24 and the main PCB disposed inside the main body.

FIG. 24 is a perspective view illustrating the scroll switch apparatus illustrated in FIGS. 1 and 2, FIG. 25 is a diagram illustrating a path through which moisture flows in FIG. 24, FIG. 26 is a view in which the main body and a knob holder are removed in FIG. 24, and FIG. 27 is a perspective view illustrating a portion of a configuration illustrated in FIG. 24 and the main PCB disposed inside the main body.

Referring to FIGS. 24 to 27, the scroll switch apparatus 600 includes a switch body 10 and the scroll switch knob 620 which is rotatably coupled to the switch body 10.

At least an outer peripheral surface of the scroll switch knob 620 may be formed of the same metal material as that of the surface of the case body 300. That is, the surface of the scroll switch knob 620 is plated with chrome, and thus, may have an approximately silvery color.

The main PCB (Printed Circuit Board) 800 may be provided inside the switch body 10, and a sensor 870 for detecting a rotation angle of the scroll switch knob 620 may be mounted on the main PCB 800. The sensor 870 may be a photosensor. When the photosensor detects the rotation angle of the scroll switch knob 620, the main PCB 800 may generate different switch signals according to the detected rotation angle of the scroll switch knob 620 and input the switch signals to the controller.

The switch body 10 may include the main body 100 and a knob holder 612. An installation portion 100A having an open upper end may be formed to protrude from an upper surface of the main body 100. The open upper end of the installation portion 100A may communicate with the main PCB 800. The knob holder 612 shields the open upper end of the installation portion 100A from the outside of the installation portion 100A, and may be installed in the installation portion 100A to be linearly movable up and down. The knob holder 612 may cover the open upper end of the installation portion 100A and a portion of a side surface of the installation portion 100A. The knob holder 612 shields the open upper end of the installation portion 100A, and thus, prevents external moisture from entering the main PCB 800 through the scroll switch knob 620.

The knob holder 612 includes an upper surface portion 612A which covers an upper end of the installation portion 100A, a side surface portion 612B which extends downward from an edge of the upper surface portion 612A to cover a portion of a side surface of the installation portion 100A, and a pusher portion 612C which is spaced apart from the inside of the side portion 612B, extends downward from a lower surface of the upper surface portion 612A, and is inserted into the inside of the installation portion 100A. The upper end of the installation portion 100A may be inserted and disposed between the side surface portion 612B and the pusher portion 612C.

The knob holder 612 may be installed in the main body 100 to be linearly moved up and down. One of guide protrusion and the guide groove for guiding the vertical movement of the knob holder 612 may be formed to be elongated vertically on an outer surface of the pusher portion 612C, and the other thereof may be formed to be elongated vertically on an inner surface of the installation portion 100A. The guide protrusion may be inserted into the guide groove to guide the vertical movement of the knob holder 612.

The user rotates the scroll switch knob 620 to move a cursor on a monitor to a desired menu or display the desired menu on the monitor. The user can press the scroll switch knob 620 downward when the cursor on the monitor is located on the desired menu or when the desired menu is displayed on the monitor, and the knob holder 612 can be moved downward with respect to the main body 100 by the force of the user pressing the scroll switch knob 620 downward. In this way, when the knob holder 612 is moved downward, the pusher portion 612C of the knob holder 612 can be operated by pressing the switch 880 provided in the main PCB 800. When the switch 880 is pressed by the pusher portion 612C, the main PCB 800 can generate the switch signal and input the switch signal to the controller, and the controller controls the menu to be executed when the switch signal is input.

A first insertion rib 612F and a second insertion rib 612G are formed to protrude from an upper surface of the knob holder 612. The first insertion rib 612F and the second insertion rib 612G may be formed to protrude from an upper surface of the upper surface portion 612A and may be disposed to be spaced apart from each other in an axial direction. The scroll switch knob 620 is formed to be elongated in the axial direction, and may be inserted and disposed between the first insertion rib 612F and the second insertion rib 612G.

A portion of the scroll switch knob 620 in the radial direction may be disposed to protrude toward one side of each of the first insertion rib 612F and the second insertion rib 612G. That is, in the drawing, an upper portion of the scroll switch knob 620 may be disposed to protrude upward from the first insertion rib 612F and the second insertion rib 612G. Each of the first insertion rib 612F and the second insertion rib 612G may be formed in a rectangular shape having an open side in the axial direction. The one side of the first insertion rib 621F which is open in the axial direction and the one side of the second insertion rib 612G which is open in the axial direction may be disposed to face each other. Moisture flowing downward along the outer surface of the scroll switch knob 620 flows to the upper surface of the upper surface portion 612A corresponding to the outer sides of the first insertion rib 612F and the second insertion rib 612B through a portion between the first insertion rib 612F and the second insertion rib 612G, and thereafter, the moisture may flow downward of the main body 100 through the outer surfaces of the side surface portion 612B and the installation portion 100A.

A first coupling rib 612D may be formed to protrude from an upper end of the first insertion rib 612F, and a second coupling rib 612E may be formed to protrude from an upper end of the second insertion rib 612G.

The scroll switch knob 620 may be rotatably coupled to the knob holder 612. A rotating shaft 627A may be formed to protrude from the scroll switch knob 620 in the axial direction. The rotating shaft 627A may be formed to axially protrude from at least one surface of the scroll switch knob 620 in the axial direction.

The rotating shaft 627A of the scroll switch knob 620 may be rotatably coupled to at least one of the first coupling rib 612D and the second coupling rib 612E in the circumferential direction. A hole having an open upper side is formed in each of the first coupling rib 612D and the second coupling rib 612E, and the rotating shaft 627A is inserted into the open hole on the upper side of each of the first coupling rib 612D and the second coupling rib 612E and may be rotatably coupled. The scroll switch knob 620 may be rotatably coupled to the second coupling rib 612E through the rotating shaft 627A in the circumferential direction, and may be rotatably provided on the switch body 10 in a circumferential direction. The scroll switch knob 620 may be rotated with the rotating shaft 627A as a rotation center.

A knob gear 629 may be installed on the rotating shaft 627A. A sensor shaft 630 may be rotatably installed in the pusher portion 612C of the knob holder 612. The rotating shaft 627A and the sensor shaft 630 may be disposed parallel to each other. The sensor shaft 630 may be rotated by a rotational force of the scroll switch knob 620. A third coupling rib 612L and a fourth coupling rib 612M may be formed to be spaced apart in the axial direction inside the pusher portion 612C. The sensor shaft 630 may be rotatably coupled to the third coupling rib 612L and the fourth coupling rib 612M. A hole having an open lower side is formed in each of the third coupling rib 612L and the fourth coupling rib 612M, the sensor shaft 630 is inserted into the open lower side on the lower side of each of the third coupling rib 612L and the fourth coupling ribs 612M, and may be rotatably coupled.

A hole (not illustrated) through which the sensor shaft 630 passes is formed in the installation portion 100A, a portion of the sensor shaft 630 may be disposed inside the installation portion 100A, and the rest thereof may be disposed outside the installation portion 100A. When the knob holder 612 is linearly moved up and down, preferably, the hole formed in the installation portion 100A through which the sensor shaft 630 passes is formed to be elongated vertically so that the sensor shaft 630 can be linearly moved up and down together with the knob holder 612.

A detection unit 635 detected by the photosensor may be formed in an inner insertion portion of the sensor shaft 630 which is inserted into the installation portion 100A. In the detection unit 635, a plurality of holes 636 may be formed along the circumferential direction, and as the sensor shaft 630 is rotated in the circumferential direction, the sensor 870 may detect the rotation angle of the detection unit 635 by sequentially detecting the hole 636 formed in the detection unit 635 and a portion other than the hole 636, and eventually, detect the rotation angel of the scroll switch knob 620. That is, the sensor 870 may detect the rotation angle in the circumferential direction of the detection unit 635 when the sensor shaft 630 is rotated in the circumferential direction, and the switch 880 may be pressed by the pusher portion 612C when the knob holder 612 linearly moves.

A first gear 631 may be formed on a protrusion of the sensor shaft 630 which is disposed to protrude to the outside of the installation portion 100A. The first gear 631 may be disposed outside the knob holder 612. The first gear 631 may be rotated by the rotational force of the knob gear 629.

A second gear 632 may be rotatably coupled to an outer surface of the knob holder 612. A shaft portion 633 may protrude from a center of one surface of the second gear 632. A hole 612H into which the shaft portion 633 is inserted and is rotatably disposed may be formed in the side surface portion 612B and the pusher portion 612C of the knob holder 612, and a coupling rib (not illustrated) to which the shaft portion 633 is rotatably coupled may be formed inside the pusher portion 612C. Here, the coupling rib may have the same structure as those of the first to fourth coupling ribs 612D, 612E, 612L, and 612M. The shaft portion 633 is inserted into the hole 612H and is rotatably coupled to the knob holder 612 through the coupling rib, and thus, the second gear 632 may be rotatably disposed outside the knob holder 612.

The second gear 632 may be disposed between the knob gear 629 and the first gear 631 and may be engaged with the knob gear 629 and the first gear 631, respectively. Therefore, when the scroll switch knob 620 is rotated, the sensor shaft 630 may be rotated. A diameter of the second gear 632 may be larger than a diameter of the knob gear 629 and a diameter of the first gear 631. The diameter of the second gear 632 is formed to be larger than the diameter of the knob gear 629 and the diameter of the first gear 631, and thus, the sensor shaft 630 is rotated only when the scroll switch knob 620 is rotated with a large rotation angle, and a precise control to generate the switch signal can be performed.

As described above, the scroll switch apparatus 600 includes the sensor 870 and the switch 880 on one main PCB 800, and when the user rotates the scroll switch knob 620, the sensor 870 detects that the detection unit 635 of the sensor shaft 630 is rotated to detect the rotation angle of the scroll switch knob 620, and when the user presses the scroll switch knob 620, the knob holder Since 612 is linearly moved to contact the switch 880, and thus, it is possible to detect that the scroll switch knob 620 is pressed.

In addition, the knob holder 612 shields the open upper end of the installation portion 100A. Accordingly, it is possible to prevent the external moisture from flowing into the main PCB 800 through a gap between the main body 100 and the knob holder 612 after flowing down through the scroll switch knob 620.

Figure 28:
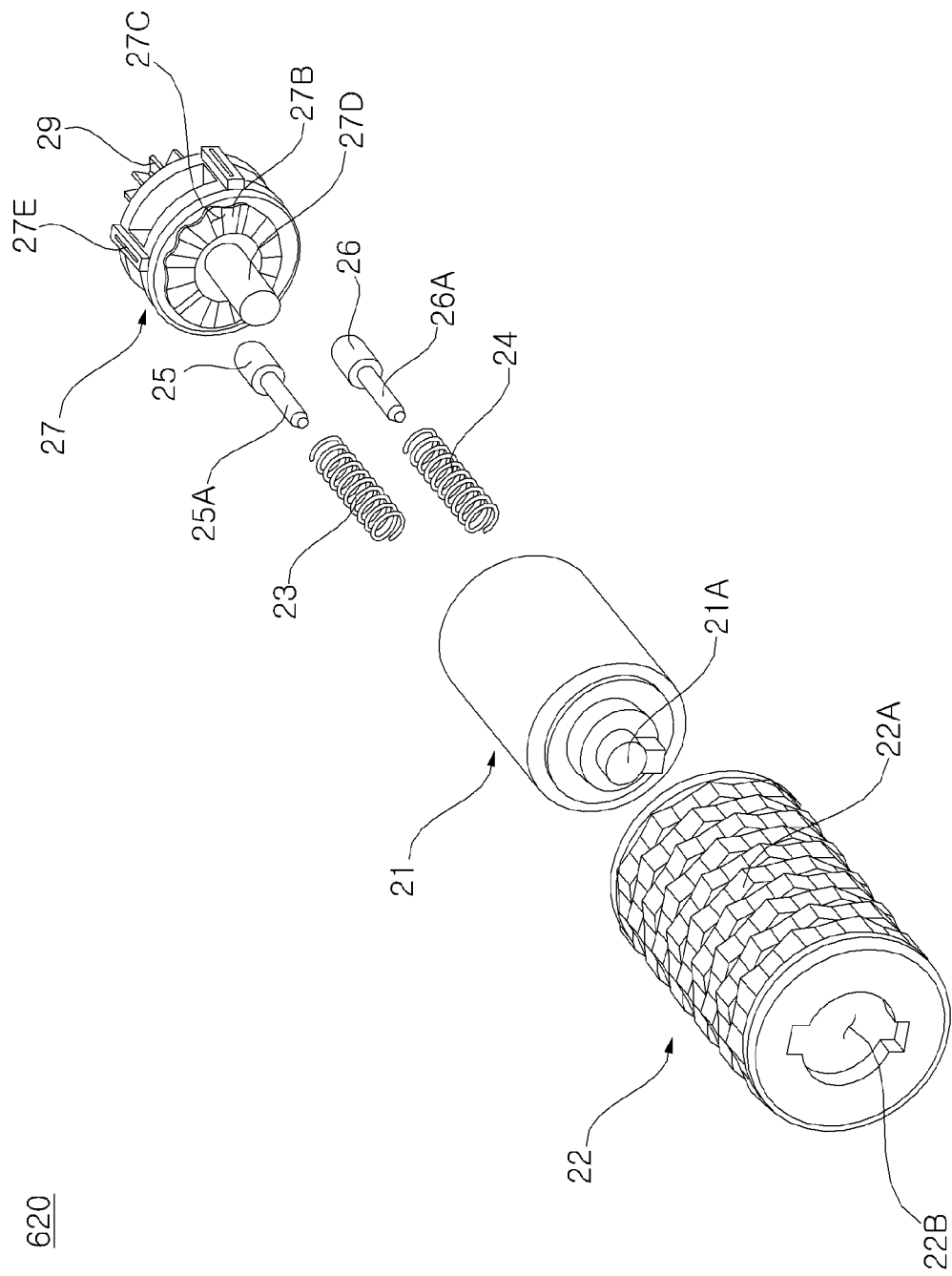
FIG. 28 is a front exploded perspective view of a scroll switch knob illustrated in FIG. 24.
Figure 29:
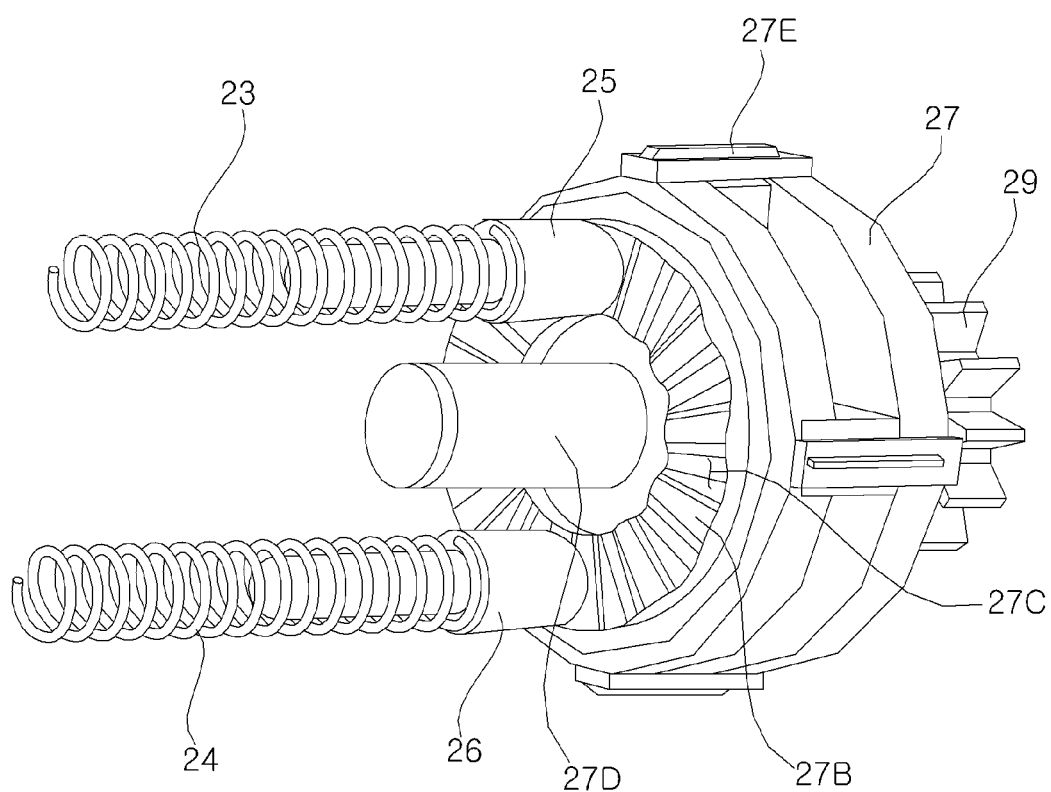
FIG. 29 is a view illustrating a combined state of an elastic member, a detent, and a cam member in FIG. 28.
Figure 30:
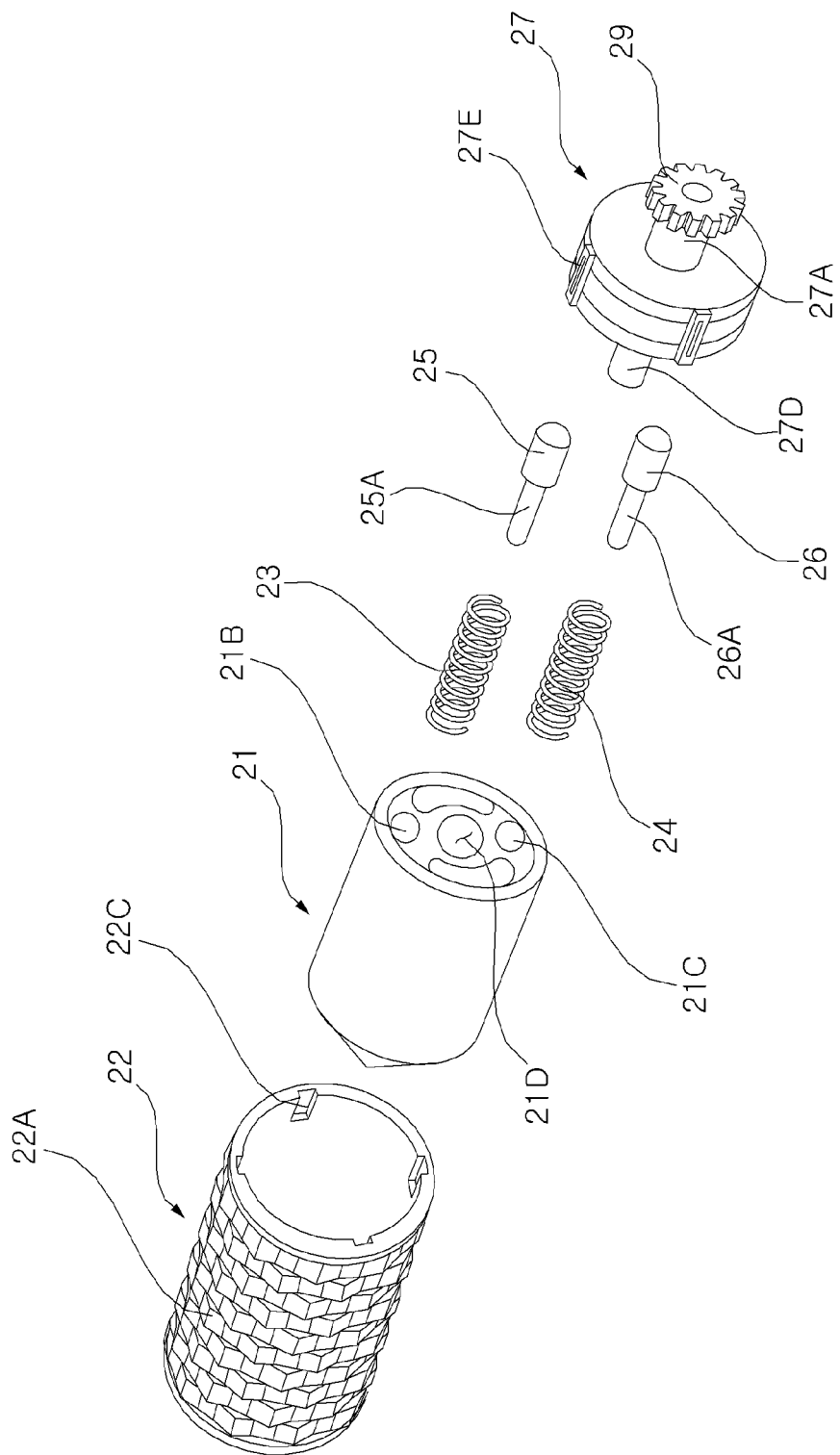
FIG. 30 is a rear exploded perspective view of the scroll switch knob illustrated in FIG. 24.

FIG. 28 is a front exploded perspective view of the scroll switch knob illustrated in FIG. 24, FIG. 29 is a view illustrating a combined state of an elastic member, a detent, and a cam member in FIG. 28, and FIG. 30 is a rear exploded perspective view of the scroll switch knob illustrated in FIG. 24.

Referring to FIGS. 28 to 30, the scroll switch knob 620 includes a detent holder 21, a scroll knob body 22, elastic members 23 and 24, detents 25 and 26, and a cam member 27.

The detent holder 21 is formed to be elongated in the axial direction, and has a circular shape when cut in the radial direction.

The finger of the user comes into direct contact with the scroll knob body 22, and the scroll knob body 22 is rotated by the finger of the user and may have a plurality of protrusions 22A formed on an outer peripheral surface of thereof. The plurality of protrusions 22A can prevent the finger of the user from slipping when the user rotates the scroll knob body 22. The scroll knob body 22 is formed to be elongated in the axial direction. An axial length of the scroll knob body 22 is longer than an axial length of the detent holder 21. The scroll knob body 22 is formed to have a hollow inner portion, and the detent holder 21 is inserted into the scroll knob body 22 to be elongated in the axial direction.

As described above, the detent holder 21 is coupled to the knob holder 612 of the switch body 10 so as not to rotate in the circumferential direction through a rotation prevention protrusion 21A. The scroll knob body 22 is rotatably provided with respect to the detent holder 21 in a circumferential direction.

The elastic members 23 and 24 are inserted into the scroll knob body 22 and installed in the detent holder 21. Each of the elastic members 23 and 24 includes a coil spring, can be compressed or tensioned in the axial direction, and can generate an elastic force in the axial direction. A plurality of elastic members 23 and 24 may be provided, and in the present embodiment, two elastic members are provided and include a first elastic member 23 and a second elastic member 24.

The detents 25 and 26 are inserted into the scroll knob main body 22 and are mounted on the detent holder 21 so that the detents 25 and 26 are elastically supported by the elastic members 23 and 24 so as to be movable in the axial direction. Each of the detents 25 and 26 may be formed to have a diameter larger than that of each of the elastic members 23 and 24. Support protrusions 25A and 26A inserted into the elastic members 23 and 24 may be formed in the detents 25 and 26, respectively. The detents 25 and 26 may be elastically supported by the elastic members 23 and 24 through the support protrusions 25A and 26A. A plurality of detents 25 and 26 may be provided to have the number corresponding to the number of the elastic members 23 and 24, and in the present embodiment, two detents 25 and 26 are provided, and the first detent 25 and the second detent 26 are provided.

The cam member 27 is coupled to the scroll knob body 22 and may be rotated together with the scroll knob body 22. In the cam member 27, vibration generating protrusions 27B and vibration generating grooves 27C are alternately formed along the circumferential direction on one surface facing the detent holder 21. When the scroll knob main body 22 rotates, the detents 25 and 26 ride over the vibration generating protrusions 27B and the vibration generating groove 27Cs. Vibration generated in the case are transmitted to the finger of the user, and thus, the user can feel the operation of rotating the scroll switch knob 20 with the touch of the finger.

A rotating shaft 27A rotatably coupled to the knob holder 612 of the switch body 10 is formed to protrude from the other surface of the cam member 27, and the scroll knob body 22 may be rotatably provided with the rotating shaft 27A as a rotation center. The rotating shaft 27A may be rotatably coupled to the second coupling rib 12E of the knob holder 612 of the switch body 10 in a circumferential direction. The rotating shaft 27A may be the rotating shaft 27A of the scroll switch knob 20.

A through hole 22B is formed on one surface of the scroll knob body 22 which is a surface opposite to the rotating shaft 27A, and the rotation prevention protrusion 21A which passes through the through hole 22B and is coupled to the switch body 10 so as not to be rotated in the circumferential direction may be formed on one surface of the detent holder 21. The rotation preventing protrusion 21A may be coupled to the first coupling rib 12D of the knob holder 12 of the switch body 10 so as not to rotate in the circumferential direction.

Insertion grooves 21B and 21C into which the elastic members 23 and 24 and the detents 25 and 26 are inserted may be formed on the other surface of the detent holder 21. The elastic members 23 and 24 and the detents 25 and 26 may be inserted into the insertion grooves 21B and 21C to be installed in the detent holder 21. Distal ends of the detents 25 and 26 protrude from the insertion grooves 21B and 21C and may come into contact with at least one of the vibration generating protrusion 27B and the vibration generating groove 27C formed on one surface of the cam member 27. A plurality of insertion grooves 21B and 21C may be formed to have a number corresponding to each of the number of the elastic members 23 and 24 and the number of the detents 25 and 26, and in the present embodiment, the first insertion groove 21B and the second insertion groove 21C are provided. The first insertion groove 21B and the second insertion groove 21C may be disposed at intervals of 180° in the circumferential direction.

A center groove 21D is formed at a center of the other surface of the detent holder 21, and a center shaft 27D which is inserted into the center groove 21D and is rotatably disposed is formed to protrude from a center of one surface of the cam member 27. The scroll knob body 22 and the cam member 27 are coupled to each other and rotated integrally. Accordingly, when the scroll knob body 22 and the cam member 27 are rotated integrally with each other, the center shaft 27D guides the rotations of the scroll knob body 22 and the cam member 27 while being rotated in the center groove 21D.

The other surface of the scroll knob body 22 may be open, and the detent holder 21, the elastic members 23 and 24, the detent 25 and 26, and the cam member 27 may be inserted into the scroll knob body 22 through the open other surface of the scroll knob body 22. The cam member 27 may shield the open other surface of the scroll knob body 22.

A coupling groove 22C may be formed in any one of the inner peripheral surface of the scroll knob body 22 and the outer peripheral surface of the cam member 27, and a coupling protrusion 27E which is inserted into the coupling groove 22C so as to be coupled may be formed in the other thereof. In the present embodiment, the coupling groove 22C is formed on the inner peripheral surface of the scroll knob body 22, and the coupling protrusion 27E may be formed on the outer peripheral surface of the cam member 27. A plurality of coupling grooves 22C and a plurality of coupling protrusions 27E may be each formed to be spaced apart from each other in the circumferential direction.

As described above, when the user rotates the scroll knob body 22 with the finger, the scroll switch knob 620 transmits a feeling of the detents 25 and 26 riding over the vibration generating protrusions 27B and the vibration generating grooves 27C alternately formed on the cam member 27 in a state of being elastically supported by the elastic members 23 and 24 to the finger of the user. Accordingly, the user can feel the operation of rotating the scroll knob body 22 with the touch of a finger.

A person skilled in a technical field to which the present disclosure belongs will be able to understand that the present disclosure can be implemented in other concrete forms without changing the technical idea or essential features. Therefore, it should be understood that the embodiments described above are illustrative and non-limiting in all respects. The scope of the present disclosure is indicated by the scope of the claims to be described later rather than the detailed description above, and it should be interpreted that the meaning and scope of the claims and all changes or modifications derived from the equivalent concept are included in the scope of the present disclosure.

What is claimed is:

1. A switch apparatus for an automobile, comprising:
a main body which has an open lower side;
a cover body which is inserted into the open lower side of the main body and is coupled to the main body;
a dial switch apparatus which is installed on the main body and has an annular wheel knob rotatable with a virtual rotation axis disposed in a vertical direction as a rotation center;
a touch type switch apparatus which is installed on the main body and has a capacitive touch pad which is touched by a user and pressed in an up-down direction;
a main PCB which is coupled to the cover body to be disposed in the main body and into which a switch signal is input from the dial switch apparatus and the touch type switch apparatus; and
a case body which is coupled to the main body and has a hole, through which the wheel knob and the capacitive touch pad are exposed, on an upper side,
wherein the capacitive touch pad is disposed inside the wheel knob,
a first installation rib is formed to protrude from an upper surface of the main body,
an input unit insertion groove into which a lower portion of the dial switch apparatus and a lower portion of the touch type switch apparatus are inserted is formed inside the first installation rib,
a first drain rib is formed to protrude downward from the main body, and a first drain hole extending downward from a bottom surface of the input unit insertion groove is formed inside the first drain rib,
the main PCB includes a through hole through which the first drain rib passes, and
a second drain rib is formed to protrude upward from the cover body, and a second drain hole into which the first drain rib is inserted is formed inside the second drain rib.

2. The switch apparatus for an automobile of claim 1, wherein the second drain rib supports a lower surface of the main PCB.

3. The switch apparatus for an automobile of claim 1, wherein a second installation rib which surrounds the first installation rib and forms a ring insertion groove between the first installation rib and the second installation rib is further formed on an upper surface of the main body,
the switch apparatus further comprises a mood ring of which a lower portion is inserted into the ring insertion groove and an upper portion protrudes from the ring insertion groove to surround the dial switch apparatus, the mood ring being illuminated by light generated by a light source provided in the main PCB.

4. The switch apparatus for an automobile of claim 3, further comprising:
a mood ring cover which surrounds an outer periphery of the second installation rib and an outer periphery of the mood ring protruding from the ring insertion groove and is coupled to the main body,
wherein an upper end of the mood ring is disposed to be higher than an upper end of the mood ring cover so that a periphery of the upper end of the mood ring is surround by the case body.

5. The switch apparatus for an automobile of claim 3, wherein a bottom surface of the ring insertion groove includes a transparent portion which is formed of a transparent material through which the light passes.

6. The switch apparatus for an automobile of claim 4, wherein the mood ring includes a lower end portion which is inserted into the ring insertion groove, an intermediate portion which extends upward from an upper end of the lower end portion and has an outer diameter smaller than that of the lower end portion, and an upper end portion which extends upward from an upper end of the intermediate portion and has an outer diameter smaller than that of the intermediate portion,
the mood ring cover is seated on a stair between the lower end portion and the intermediate portion to surround peripheries of the intermediate portion and the second installation rib and is coupled to the main body, and
the case body is seated on a stair between the intermediate portion and the upper end portion to surround a periphery of the upper end portion and is coupled to the main body.

7. The switch apparatus for an automobile of claim 1, further comprising:
a scroll switch apparatus which is installed on the main body and has a scroll switch knob rotatable with a rotating shaft disposed in a horizontal direction as a rotation center, wherein a switch signal from the scroll switch apparatus is further input to the main PCB, and a hole through which the scroll switch knob is exposed is formed on an upper side of the case body.

8. The switch apparatus for an automobile of claim 7, wherein the scroll switch apparatus further includes a knob holder which shields an open upper end of an installation portion outside the installation portion formed to protrude from the upper surface of the main body and is installed in the installation portion to be linearly movable and has a pusher portion inserted into the installation portion, and to which the scroll switch knob is rotatably coupled, and a sensor shaft which is rotatably coupled to the knob holder in the circumferential direction to be rotated by a rotational force of the scroll switch knob and has a detection unit at a portion inserted into the main body, the rotating shaft disposed in the horizontal direction is formed to protrude in an axial direction from the scroll switch knob, and the main PCB includes a sensor which detects a circumferential rotation angle of the detection unit when the sensor shaft is rotated in the circumferential direction and a switch which is contacted by the pusher portion when the knob holder moves linearly.

9. The switch apparatus for an automobile of claim 8, wherein the knob holder includes an upper surface portion which covers the open upper end of the installation portion, and a side surface portion which extends downward from an edge of the upper surface portion to cover a portion of a side surface of the installation portion, the pusher portion is spaced apart from an inside of the side surface portion and extends downward from a lower surface of the upper surface portion, the open upper end of the installation portion is inserted into between the side surface portion and the pusher portion, a first insertion rib and a second insertion rib which are spaced apart from each other in the axial direction are formed to protrude from the upper surface portion, the scroll switch knob is inserted into between the first insertion rib and the second insertion rib, and the rotating shaft disposed in the horizontal direction is rotatably coupled to at least one of coupling ribs respectively formed in the first insertion rib and the second insertion rib.

10. The switch apparatus for an automobile of claim 8, wherein a knob gear disposed outside the knob holder is formed on the rotating shaft disposed in the horizontal direction, a first gear rotated by a rotational force of the knob gear is formed in a portion of the sensor shaft disposed outside the knob holder, and a second gear is further provided, which is formed to have a diameter larger than those of the knob gear and the first gear to engage with the knob gear and the first gear, and is rotatably coupled to the knob holder to be disposed outside the knob holder.

11. The switch apparatus for an automobile of claim 7, wherein the scroll switch knob includes a detent holder which is formed to be elongated in the axial direction, a scroll knob body which is formed to be elongated in the axial direction so that the detent holder is inserted into the scroll knob body to be elongated in the axial direction and is provided in the circumferential direction to be rotatable with respect the detent holder, an elastic member which is inserted into the scroll knob body and is installed in the detent holder, a detent which is inserted into the scroll knob body, is elastically supported by the elastic member, and is installed in the detent holder to be movable in the axial direction, and a cam member which is coupled to the scroll knob body to be rotated together with the scroll knob body and in which a vibration generating protrusion and a vibration generating groove over which the detent rides when the scroll knob body rotates are alternately formed on one surface facing the detent holder along the circumferential direction.

12. The switch apparatus for an automobile of claim 1, further comprising:

a push switch apparatus which is installed on the main body and has a push button pressed in the up-down direction by the user, wherein a switch signal from the push switch apparatus is further input to the main PCB, and a hole through which the push button is exposed is formed on the upper side of the case body.

13. The switch apparatus for an automobile of claim 1, wherein the capacitive touch pad includes a plastic portion which is molded with an acrylic resin, anti-glare portion which is coated on an upper surface of the plastic portion, and an anti-fingerprint portion which is coated on an upper surface of the anti-glare portion, and in the capacitive touch pad, after the anti-glare portion is coated on the upper surface of the plastic portion and the anti-fingerprint portion is coated on the upper surface of the anti-glare portion, the reinforcement heat treatment is performed to secure a hardness.

14. A switch apparatus for an automobile, comprising:

a main body which has an open lower side;

a cover body which is inserted into the open lower side of the main body and is coupled to the main body;

a dial switch apparatus which is installed on the main body and has an annular wheel knob rotatable with a virtual rotation axis disposed in a vertical direction as a rotation center;

a touch type switch apparatus which is installed on the main body and has a capacitive touch pad which is touched by a user and pressed in an up-down direction;

a main PCB which is coupled to the cover body to be disposed in the main body and into which a switch signal is input from the dial switch apparatus and the touch type switch apparatus; and a case body which is coupled to the main body and has a hole, through which the wheel knob and the capacitive touch pad are exposed, on an upper side, wherein the capacitive touch pad is disposed inside the wheel knob, wherein the touch type switch apparatus further includes a PCB to which a touch signal of the capacitive touch pad is input, a case which has open upper side and lower side and the open upper side covered with capacitive touch pad and into which the PCB is inserted, a cover which is inserted into the open lower side of the case to cover the open lower side of the case, is coupled to the case, and in which an actuator vibrating in a horizontal direction during operation is installed, and a base which is installed below the cover to be coupled to the cover, has a hinge shaft disposed in the horizontal direction, is rotatable up and down with the hinge shaft as a rotation center, and has a lower surface from which a pusher portion is formed to protrude, and when the base is rotated downward with the hinge shaft as the rotation center, the pusher portion contacts a switch provided on an upper surface of the main PCB to operate the actuator.

15. The switch apparatus for an automobile of claim 14, wherein a light source is disposed on a lower surface of the PCB,
- a first stair portion which protrudes in a radial direction and has an upper surface formed in a horizontal plane and in which the PCB is seated on the upper surface, and a second stair portion which protrudes in the radial direction from a lower portion of the first stair portion, has an upper surface formed in a horizontal plane, and extends to a lower side of the light source are formed inside the case, and
- the second stair portion guides light to the first stair portion and the outside of the case to illuminate the case while being illuminated by light emitted by the light source.

16. A switch apparatus for an automobile, comprising:
a main body which has an open lower side;
a cover body which is inserted into the open lower side of the main body and is coupled to the main body;
a dial switch apparatus which is installed on the main body and has an annular wheel knob rotatable with a virtual rotation axis disposed in a vertical direction as a rotation center;
a touch type switch apparatus which is installed on the main body and has a capacitive touch pad which is touched by a user and pressed in an up-down direction;
a main PCB which is coupled to the cover body to be disposed in the main body and into which a switch signal is input from the dial switch apparatus and the touch type switch apparatus; and
a case body which is coupled to the main body and has a hole, through which the wheel knob and the capacitive touch pad are exposed, on an upper side,
wherein the capacitive touch pad is disposed inside the wheel knob,
wherein the dial switch apparatus further includes an annular inner wheel, an annular outer wheel which is coupled to an outer periphery of the inner wheel to be rotatable in a circumferential direction and to which the wheel knob is coupled, and an annular wheel base which is disposed below the inner wheel and the outer wheel so that the inner wheel is coupled to the wheel base to be movable up and down and has a pusher portion formed to protrude from a lower surface,
the wheel knob covers upper sides of the inner wheel and the outer wheel, and
when the wheel knob is pressed downward, the pusher portion contacts a switch provided on an upper surface of the main PCB.

17. The switch apparatus for an automobile of claim 16, wherein a magnet is inserted into a lower surface of the outer wheel, and
- a Hall sensor which detects rotation angles of the wheel knob and the outer wheel in response to the magnet is provided in the wheel base.

18. The switch apparatus for an automobile of claim 16, wherein an accommodation groove is formed on an upper surface of the wheel base,
the switch apparatus further comprises:
an elastic member which is accommodated in the accommodation groove; and
a support member which is elastically supported by the elastic member, is disposed in the accommodation groove so as to be movable up and down, and has an upper end which protrudes upward from the wheel base through the accommodation groove to support the inner wheel.

19. The switch apparatus for an automobile of claim 16, wherein a hook hole communicating vertically is formed on an upper surface of the wheel base at a position corresponding to the pusher portion, and
- a hook portion which is inserted into the hook hole and couples the inner wheel to the wheel base so as to be movable up and down is formed to protrude downward from the inner wheel.

* * * * *